United States Patent
Diprose

(10) Patent No.: US 11,122,792 B2
(45) Date of Patent: Sep. 21, 2021

(54) APPARATUS AND METHOD FOR ELECTRICALLY KILLING PLANTS

(71) Applicant: Ubiqutek LTD, Birmingham (GB)

(72) Inventor: Michael Frederik Diprose, Royal Sutton Coldfield (GB)

(73) Assignee: Ubiqutek LTD

( * ) Notice: Subject to any disclaimer, the term of this patent is extended or adjusted under 35 U.S.C. 154(b) by 0 days.

(21) Appl. No.: 16/803,674

(22) Filed: Feb. 27, 2020

(65) Prior Publication Data
US 2020/0281186 A1    Sep. 10, 2020

Related U.S. Application Data

(63) Continuation of application No. 15/564,082, filed as application No. PCT/GB2016/050899 on Mar. 31, 2016, now abandoned.

(30) Foreign Application Priority Data

Apr. 4, 2015 (GB) .................................... 1505832

(51) Int. Cl.
*A01M 21/04* (2006.01)
*G01R 27/18* (2006.01)

(52) U.S. Cl.
CPC .......... *A01M 21/046* (2013.01); *A01M 21/04* (2013.01); *A01M 21/043* (2013.01); *G01R 27/18* (2013.01)

(58) Field of Classification Search
CPC ............................. A01M 21/04; A01M 21/046
USPC ................................................ 47/1.3, 58.1 R
See application file for complete search history.

(56) References Cited

U.S. PATENT DOCUMENTS

| | | | |
|---|---|---|---|
| 2,596,504 A | 5/1952 | Opp | |
| 3,935,670 A | 2/1976 | Pluenneke et al. | |
| 5,508,620 A | 4/1996 | Pfiffner | |
| 6,080,362 A | 6/2000 | Wong et al. | |
| 6,237,278 B1 * | 5/2001 | Persson | A01M 21/046 47/1.3 |
| 2006/0265946 A1 | 11/2006 | Schwager et al. | |
| 2009/0315538 A1 | 12/2009 | Han | |

FOREIGN PATENT DOCUMENTS

| | | |
|---|---|---|
| FR | 2770969 A1 | 5/1999 |
| JP | 2003250421 A | 9/2003 |

OTHER PUBLICATIONS

"Weedinator! The New Pesticide-Free Way to Clear your Garden. But Beware . . . It Packs as Many Volts as the Electric Chair,"; dailymail.co.uk; <https://www.dailymail.co.uk/news/article-2090021/Weedinator-The-new-pesticide-free-way-clear-garden-But-beware--packs-volts-electric-chair.html (Year: 2012).*
International Search Report, dated Nov. 3, 2015, in PCT/GB2015/052168; filed Jul. 27, 2015.
(Continued)

*Primary Examiner* — Christopher D Hutchens
*Assistant Examiner* — Steven J Shur
(74) *Attorney, Agent, or Firm* — Dunlap Codding, P.C.

(57) ABSTRACT

An apparatus to electrically kill a plant or at least attenuate plant growth is disclosed herein, wherein the apparatus comprises at least an electrical energy processing unit and an electrical continuity system. Also disclosed are methods of producing and using same.

21 Claims, 9 Drawing Sheets

(56) References Cited

OTHER PUBLICATIONS

Written Opinion of the International Searching Authority, dated Nov. 3, 2015, in PCT/GB2015/052168, filed Jul. 27, 2015.
U.S. Appl. No. 15/564,082; Michael F. Diprose; filed Oct. 3, 2017; Office Action dated May 16, 2019.
U.S. Appl. No. 15/564,082; Michael F. Diprose; filed Oct. 3, 2017; Amendment and Response to Office Action filed Aug. 16, 2019.
U.S. Appl. No. 15/564,082; Michael F. Diprose; filed Oct. 3, 2017; Final Office Action dated Oct. 29, 2019.
U.S. Appl. No. 15/329,789; Michael F. Diprose; filed May 31, 2017; Office Action dated Apr. 16, 2019.
U.S. Appl. No. 15/329,789; Michael F. Diprose; filed May 31, 2017; Amendment and Response to Office Action filed Aug. 5, 2019.
U.S. Appl. No. 15/329,789; Michael F. Diprose; filed May 31, 2017; Final Office Action dated Oct. 29, 2019.
Elliott, Valerie; "Weedinator! The New Pesticide-Free Way to Clear your Garden. But Beware . . . It Packs as Many Volts as the Electric Chair,"; Daily Mail.com (Jan. 21, 2012); https://www.dailymail.co.uk/news/article-2090021/Weedinator-The-new-pesticide-free-way-clear-garden-But-beware--packs-volts-electric-chair.htrnl; 4 pages.
Bell, Carl; "Electrocuting Weeds," UC Weed Science—ANR Blogs (Feb. 26, 2014); 3 pages.
"Lightning Weeder: Kills Weeds With Electricity," Farm Show Magazine (1981) 5(2):21.
International Search Report, dated Jul. 21, 2016, in PCT/GB2016/050899, filed Mar. 31, 2016.
Written Opinion of the International Searching Authority, dated Jul. 21, 2016, in PCT/GB2016/050899, filed Mar. 31, 2016.
Mizuno, et al.; "A Portable Weed Control Device Using High Frequency AC Voltage," Industry Applications Society Annual Meeting (1993), pp. 2000-2003.
Mizuno, et al.; "Destruction of Weeds by Pulsed High Voltage Discharges," Conference Record of the Industry Applications Society Annual Meeting (1990), vol. 1, pp. 720-727.

\* cited by examiner

APPARATUS AND METHOD FOR ELECTRICALLY KILLING PLANTS

CROSS-REFERENCE TO RELATED APPLICATIONS/INCORPORATION BY REFERENCE STATEMENT

This application is a continuation of U.S. Ser. No. 15/564,082, filed Oct. 3, 2017; which is a US national stage application filed under 35 USC § 371 of International Application No. PCT/GB2016/050899, filed Mar. 31, 2016; which claims priority to GB App No. 1505832.4, filed Apr. 4, 2015. The entire contents of the above-referenced patent applications are hereby expressly incorporated herein by reference.

TECHNICAL FIELD

The present disclosure relates to electric apparatus that is configured to attenuate plant growth by the application of electrical energy thereto.

BACKGROUND

In properties both commercial and domestic it is common to kill or at least control the growth of unwanted plants, commonly referred to as weeds. A conventional process for doing so is to extract manually, or by means of a mechanical implement, the weed from the ground. It is preferable to extract the weed in its entirety with its roots intact, as a portion that remains in the ground can re-grow. A drawback with such a process is that ensuring entire extraction is laborious and particularly difficult. A further drawback is that weeds can seed or re-grow quickly, particularly in warm and wet climates, which means that regular repetitions of the process are required. A yet further drawback is that mechanically removing a weed can disturb the surrounding soil such that: buried seeds are surfaced; crops/seeds are inadvertently removed via the interconnecting soil of the weed that is removed with the weed; the soil is subject to nutrient and moisture loss.

A solution to the above drawbacks is the process of chemically poisoning the weed by means of a pesticide, or more particularly a herbicide. Desirably, herbicides can be formulated to selectively target specific weeds whilst leaving a desired crop relatively unharmed. Such herbicides may function by interfering with the growth of the weed and are often synthetic mimics of natural plant hormones. Exposure of herbicides to humans and animals can arise as a result of improper application, for example, contact during application or as a residue on foodstuffs or other contamination of the food chain. Such exposure is undesirable since a known drawback with herbicides is that they can be toxic to humans and animals. More particularly, herbicides can cause various health problems such as skin and respiratory conditions. There are also concerns over carcinogenicity (e.g. Triazine and Phenoxy herbicides) as well as a relationship with Parkinson's disease. A further drawback is that herbicides are not always successful in killing the target weeds. A yet further drawback is that herbicides can be washed off plants if rain follows their application or blown away due to wind thereby restricting the times of application. A yet further drawback is that herbicides can be harmful to the surrounding environment, for example, they can be transported via leaching or surface runoff to contaminate groundwater or distant surface water sources. Transport of herbicides is promoted by intense rainfall and soils with limited absorption and retention. These effects are confounded if the particular herbicide has high persistence (resistance to degradation) and water solubility. As a result of these numerous drawbacks there are increasingly severe restrictions on the use of herbicides, particularly throughout the European Union. Moreover, as a result of these numerous drawbacks consumers are increasingly demanding organic produce, for which the use of herbicides is prohibited.

A solution to the above drawbacks is the process of killing the weed by means of the application of electrical energy thereto. Apparatus used in such a process generally comprise: an electrical energy source that is arranged with a high-voltage side in electrical contact with applicator electrodes; the applicator electrodes configured to transfer the high-voltage to the weed; a low-voltage side of the electrical energy source connected to ground thus completing a circuit whereby the load comprises a current drawn through the weed. Advantageously, such a process does not contaminate the environment to the same extent as a herbicidal process nor is it as toxic to humans and animals.

U.S. Pat. No. 4,338,743 discloses such apparatus, wherein the electrical energy source comprises an engine-generator and a high-voltage transformer. The generator supplies electrical current to a primary winding of the high-voltage transformer, the high-voltage transformer has a secondary winding electrically connected to applicator electrodes. The applicator electrodes are configured for direct transmission of the high-voltage to weeds. The apparatus is for agricultural use and is disposed on a vehicle that can be towed by an agricultural vehicle. The apparatus functions in a first mode: wherein the high-voltage is applied to the applicator electrodes, or in a stand-by mode: wherein electrical energy is supplied from the generator to electrical outlets that can be used to supply other agricultural equipment. The apparatus is operable to generate 14.4 kV at 60±5 Hz at the applicator electrodes. A drawback with this apparatus is that the high-voltage transformer is bulky. A further drawback is that the output at the applicator electrodes is particularly dangerous to humans and animals.

U.S. Pat. No. 5,600,918 discloses further such apparatus, wherein the electrical energy source comprises a piezoelectric crystal and an actuator. The actuator is configured to apply a compressive force to the piezoelectric crystal to thereby generate a high-voltage that is electrically connected to the applicator electrodes. The apparatus is operable to generate 50-1500 V in short bursts at the applicator electrodes. Advantageously, the apparatus does not require a bulky transformer, however it is limited to non-agricultural applications due to the particularly limited power the piezoelectric crystal can supply.

A solution to some of the drawbacks of the above apparatus is provided in JP 2002360151, which discloses a yet further such apparatus, wherein the electrical energy source comprises a battery that supplies a direct current of 24 V to an oscillating unit and a high-voltage transformer. The oscillating unit outputs an oscillating signal to transistors that switch with the oscillating signal to effect the switching of a current through a primary coil of the high-voltage transformer. The high-voltage transformer is configured such that the voltage over a secondary coil is stepped-up to 6 kV with a frequency of 15 kHz and a low current of 0.5 mA. The secondary coil is electrically connected to an electrode that comprises a dielectric outer layer. The apparatus is configured to cause corona discharge at the leaves of the weed and yield ozone that acts to chemically poison the weed. Due to the particular low current the body of the weed is generally not targeted. Accordingly the apparatus is in general limited to the treatment of small areas and is therefore not suitable for agricultural use.

A further solution to some of the drawbacks of the above apparatus is provided in JP H3-83534, and the related publication: 'Destruction of Weeds by Pulsed High-Voltage Discharges', A. Mizuno, T. Tenma and N. Yamano, Toyohashi University of Technology, 1990, wherein the electrical energy source comprises a DC electrical source and a capacitor. The capacitor is sequentially: connected to the DC electrical source and charged; disconnected from the DC electrical source; connected to an applicator electrode and discharged therefrom as a spark. The applicator electrode transmits the generated spark through the air to the nearest weed, i.e. without direct contact between the weed and electrode. Accordingly the apparatus is not configured for direct contact between the applicator electrode and the weed. The spark comprises 15 kV at 30 pulses per second. A drawback with this apparatus is that the path of the spark is potentially unpredictable due to arcing and therefore could be transmitted to nearby humans and animals. A further drawback is that since the voltage is particularly high there is a significant risk of injury from high current transfer. A yet further drawback is that there is a risk of fire due to ignition of the weed/surrounding plants. A yet further drawback is that the use of a capacitor in this way generally limits the apparatus to the treatment of small areas and small weeds: the apparatus it is therefore not particularly suitable for agricultural use.

A yet further solution to some of the above drawbacks of the above apparatus is provided in the publication: 'A Portable Weed Control Device using High Frequency AC Voltage', A. Mizuno, A. Nagura, T. Miyamoto and A. Chakrabarti, Toyohashi University of Technology, 2001, wherein an electrical energy source comprises a DC electrical source that supplies a direct current of 12V to an oscillating circuit and a high-voltage transformer. The oscillating circuit outputs an oscillating signal to effect the switching of a current through a primary coil of the high-voltage transformer. The high-voltage transformer is configured such that the voltage over a secondary coil is stepped-up to 3 kV with a frequency of 12.5 kHz. The secondary coil is electrically connected to an applicator electrode, which is in electrical contact with a weed. A drawback with this apparatus is that high-voltage output at the applicator electrodes is still particularly dangerous to humans and animals. A further drawback is that the apparatus is in general limited to the treatment of small areas and is therefore not suitable for agricultural use.

BRIEF DESCRIPTION OF THE DRAWINGS

For a better understanding of the present disclosure, and to show how certain non-limiting embodiments of the same may be carried into effect, reference will now be made by way of example to the accompanying diagrammatic drawings in which.

DETAILED DESCRIPTION

Figure 1:
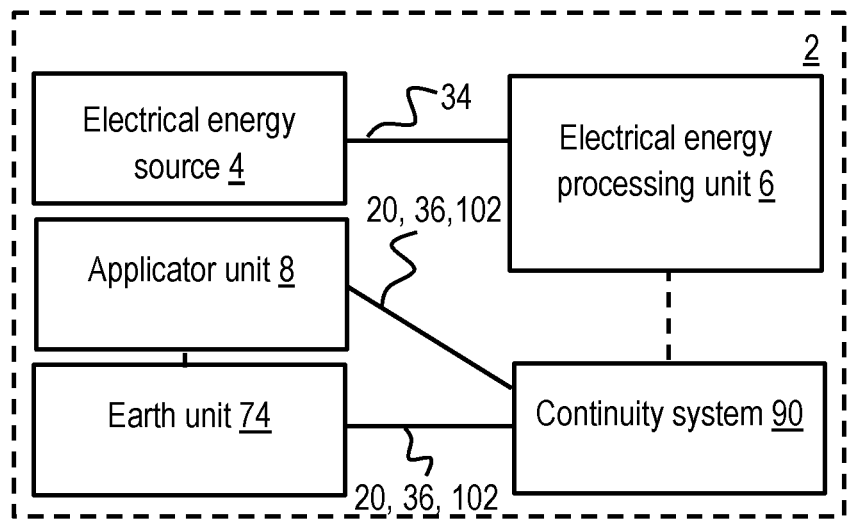
FIG. 1 is a block diagram of electrical weed killing apparatus according to the present disclosure.

One non-limiting aspect of the present disclosure is to provide apparatus to electrically control plant growth that is relatively safe to use.

It would be advantageous to provide apparatus to electrically control plant growth that is effective such that it may replace herbicides and/or physical extraction in a range of environments, i.e.: agricultural; commercial (e.g. on sports fields, golf courses); private non-commercial (home use).

It would be advantageous to provide apparatus to electrically control plant growth that is cost-effective to manufacture.

It would be advantageous to provide apparatus to electrically control plant growth that is compact.

It would be advantageous to provide apparatus to electrically control plant growth that is convenient to use.

It would be advantageous to provide apparatus to electrically control plant growth that can quickly control plant growth.

Certain non-limiting aspects of the present disclosure are achieved by the apparatus according to claim 1 and the method according to claim 19.

Disclosed herein according to a first non-limiting aspect of the present disclosure there is provided apparatus to electrically kill a plant or at least attenuate plant growth comprising an electrical energy processing unit and an electrical continuity system. The electrical energy processing unit to transmit electrical energy, which is typically processed electrical energy, between an applicator electrode of an applicator unit and an earth electrode of an earth unit (e.g. typically including through the ground). The electrical continuity system comprising: a signal generator configured to generate a continuity signal and to transmit said signal around a continuity circuit including, or in operational proximity to (e.g. to enable a representative measurement at), one or both of the said electrode(s); a signal processing arrangement configured to at least partially isolate the transmitted continuity signal from the processed electrical energy (e.g. when sharing an electrically common path); a control circuit operable to: determine, using said isolated continuity signal or a property related thereto, an electrical continuity between the ground and one or both of the said electrodes; control, using said determined electrical continuity, the processed electrical energy.

Advantageously non-limiting aspects of the present disclosure are solved since the apparatus is safe to use as the processed electrical energy can be controlled such that it is only transmitted when the determined electrical continuity is above a predetermined amount. In this way the processed electrical energy can be prevent from being transmitted when it may cause damage to a user, the device, or surroundings, e.g. by electrical arcing.

Transmission of the continuity signal to, or in operational proximity to, one or both of the said electrode(s) may comprise one of the following arrangements. In a first arrangement it is transmitted in operational proximity to the applicator electrode and/or an earth electrode. In this arrangement the continuity signal can be transmitted in operational proximity to the same electrode, in this instance it is transmitted proximate (e.g. within 1-5 cm) thereto, and distal (e.g. 20-50 cm or 20 cm-2 m away from) therefrom such that the continuity signal travels through the ground sufficiently proximate the said electrode for a representative measurement of the electrical continuity between the ground and the said electrode. Alternatively in this arrangement the continuity signal is transmitted proximate to both of the applicator and earth electrodes (e.g. within 1-5 cm of each electrode), such that the continuity signal travels sufficiently proximate to both electrodes to enable a representative measurement of the electrical continuity between them and the ground. In a second arraignment it is transmitted between the applicator electrode and an earth electrode. In this arrangement the continuity signal is transmitted along the same path as the processed electrical energy between the earth and applicator electrodes. In a third arrangement it is transmitted between the ground and one or both of the applicator electrode and an earth electrode. In this arrangement it can be transmitted between the said electrode and proximate thereto (e.g. 20-50 cm or 20 cm-2 m away from) such that the continuity signal travels from the ground to the electrode to enable a representative measurement of the electrical continuity at the said electrode. Alternatively in this arrangement it can be transmitted between one of the electrodes and proximate the other electrode (e.g. within 1-5 cm) such that the continuity signal travels from the electrode to ground an proximate the other electrode to enable a representative measurement of the electrical continuity between the ground and both electrodes.

The control circuit may be a control circuit of the electrical energy processing unit and/or the continuity system.

The apparatus may comprise an applicator unit comprising the applicator electrode. The applicator electrode may comprise an electrically conductive material (e.g. a material with high electrical conductivity, such as a metal and not a dielectric material), which is connected to the converter of the electrical energy processing unit to receive therefrom the processed electrical energy. In certain non-limiting embodiments, the applicator electrode is configured for direct transmission of the processed electrical energy to a plant, e.g. a substantial portion of the applicator electrode is exposed so that it can touch a plant for the direct transmission of the processed electrical energy thereto. The applicator electrode may alternatively be configured for transmission of the processed electrical energy to the plant by arcing, i.e. spark transmission, without directly touching the plant (e.g. it has associated therewith an insulating housing to prevent direct contacting between the electrode and plant). The applicator electrode of the applicator unit may further comprise a dielectric material, which is arranged with the processed electrical energy transmitted through (e.g. substantially or fully through) the said dielectric material to a treated plant (e.g. transmission is in the order of: electrically conductive material; dielectric material; plant). In certain non-limiting embodiments, the dielectric material is operable to conduct the processed electrical energy by capacitive action. The dielectric material may comprise a layer or coating on the electrically conductive material, e.g. on an exposed outer surface thereof. The dielectric material may have a thickness of at least 0.1 or 0.5 or 1 mm. The dielectric material may have a maximum thickness less than or equal to 2 or 5 or 10 mm.

The apparatus to electrically control plant growth may comprise an earth unit comprising the earth electrode. The earth electrode may comprise an electrically conductive material (e.g. a material with high electrical conductivity, such as a metal and not a dielectric material), which is connected to the converter to receive the processed electrical energy transmitted from the applicator unit through a load comprising a plant. The earth unit completes a current path comprising the: electrical energy source; electrical energy processing unit; applicator unit; treated plant; ground; earth unit; electrical energy processing unit; electrical energy source. The earth electrode may be configured to receive the high voltage electrical energy when inserted into the ground. Alternatively, the earth electrode may be configured to receive the high voltage electrical energy when resting on a surface of the ground, i.e. to maintain electrical continuity between the ground and the earth electrode when resting on the surface of ground, e.g. such that the processed electrical energy transmitted from the applicator unit to a plant and into the ground can be transmitted from the ground to the earth unit without the earth unit needing to be inserted into the ground. In certain non-limiting embodiments, the earth electrode is configured to maintain electrical continuity with the ground whilst being moved along the ground, e.g. by sliding or rolling as part of a rotary member. Typically an earth electrode of this type is configured to have a substantially flat surface to abut the ground, e.g. with a surface area of at least 5 or 10 or 20 or 50 cm$^2$, e.g. as a plate. Typically an earth unit of this type is for use when the frequency of the processed electrical energy is above 20 or 25 or 40 or 50 or 75 or 100 kHz. The earth electrode of the earth unit may further comprise a dielectric material, which is arranged with the processed electrical energy being transmitted through (e.g. substantially or fully through) the said dielectric material to the electrically conductive material (e.g. transmission is in the order of: plant; dielectric material; electrically conductive material). In certain non-limiting embodiments, the dielectric material is operable to conduct the processed electrical energy by capacitive action. The dielectric material may comprise a layer or coating on the electrically conductive material, e.g. on an exposed outer surface thereof. The dielectric material may have a thickness of at least 0.1 or 0.5 or 1 mm. The dielectric material may have a maximum thickness less than or equal to 2 or 5 or 10 mm.

The apparatus may comprise more than one earth electrode. The or each earth electrode may be electrically connected to each other. One or more of the plurality of electrodes may be electrically isolated. One or more of the plurality of electrodes may comprise a separate signal processing arrangement and control circuit as described herein. An advantage is that the plurality of earth electrodes can be spaced apart by a suitable amount to provide multiple possible routes for the continuity circuit, whereby if there is insufficient continuity with one of the electrodes another with sufficient continuity can be utilised for the continuity circuit. The plurality of earth electrodes may be arranged in separate earth units, for example, there may be a plurality of earth units each comprising one or more earth electrodes that may be connected with one of the aforesaid arrangements.

The apparatus to electrically control plant growth may comprise an electrical energy source connected to the electrical energy processing unit and/or means for connecting an electrical energy source to the electrical energy processing unit (e.g. a plug). The electrical energy source may comprise one of the electrical energy sources selected from the following: engine-generator; battery; fuel cell; mains electrical supply; vehicle power take-off shaft driving a generator. The electrical energy source (as in the aforementioned examples) may be a portable (e.g. the battery) or external source (e.g. an AC line supply). The means for connecting may comprise part of an electrical interface, e.g. a plug.

The electrical continuity system generally comprises the continuity circuit for transmission of the continuity signal. The continuity circuit generally comprises first and second continuity electrodes with the continuity signal transmitted therebetween. The first and second continuity electrodes may have an arrangement selected from one of the following: the first and second continuity electrodes are incorporated with (i.e. electrically common to) the respective applicator electrode and earth electrodes; the first continuity electrode is incorporated with the applicator electrode and the second continuity electrode is arranged in operational proximity to, without being incorporated with, one of the applicator electrode or earth electrode; the second continuity electrode is incorporated with the earth electrode and the first continuity electrode is arranged in operational proximity to, without being incorporated with, one of the applicator electrode or earth electrode; the first continuity electrode is arranged in operational proximity to, without being incorporated with, one of the applicator electrode or earth electrode and the second continuity electrode is arranged in operational proximity to, without being incorporated with, one of the applicator electrode or earth electrode.

Operational proximity may be defined as any suitable distance to enable a representative measurement of the electrical continuity at the associated electrode, i.e. the earth or applicator electrode (e.g. with the continuity signal transmitted from the said electrode through the ground and to the continuity electrode), e.g. 1 cm-2 m or 2 cm-50 cm along or through the ground from the relevant applicator or earth electrode. The exact distance will depend on the properties of the continuity signal transferred therebetween, together with other operational parameters, such as soil moisture content etc.

The electrical energy processing unit and electrical continuity system may be configured to generate respective processed electrical energy and continuity signals that can be at least partially filtered from each other by one or more filters of the signal processing arrangement. The filters may be filters selected from a list comprising: high-pass; low-pass; band-pass; band stop. Other such filters may comprise analogue amplifiers with mechanical resonators, digital filters (following conversion to digital data) etc.

The electrical energy processing unit may be configured to generate processed electrical energy that is non-steady and comprises a waveform with a repeating unit that repeats at a frequency (e.g. an AC or DC). The frequency is defined as the number of repeating units of the waveform per unit time. A repeating unit is defined as a unit that repeats with substantially the same form, e.g. it may comprise waveforms of substantial the same shape including when the amplitude and/or duty cycle or period is adjusted for control of the processed electrical energy. The said frequency may be at least 18 kHz, or more particularly of at least: 20 or 25 or 40 or 50 kHz. Alternatively the said frequency may be lower e.g. at least 20 or 50 Hz. The maximum frequency may be 5 MHz or 2 MHz, or 1 MHz, or 500 kHz, or 350 kHz, or 100 kHz, or 75 kHz, or 50 kHz or any value therebetween. The waveform may be a periodic or aperiodic waveform, i.e. a waveform that continuously repeats with the repeating units therein having a constant or a varying period, e.g. a pulsed wave with a fixed duty cycle or a varying duty cycle. The shape of the repeating unit may be one of or a combination of one or more of the following forms: sine wave; saw-tooth wave; triangular wave; square wave; pulsed, e.g. DC pulsatile, half-wave rectified; full-wave rectified; other known form. The exact shape of the repeating unit may be an approximation of one of the aforesaid forms for reasons of distortion, e.g. overshoot/undershoot and the associated ringing and settle time. The repeating unit may be positive or negative or a combination thereof with respect to a reference value, which is typically 0 V. The non-steady processed electrical energy is suitable for killing a plant or at least attenuating plant growth, e.g. it comprises a waveform with frequency and voltage to electrically kill a plant or at least attenuate plant growth. The processed electrical energy may have a peak voltage of above 1 kV or more particularly within one of the following ranges: 1 kV to 30 kV; 2 kV to 20 kV; 2.5 kV to 17.5 kV. The peak voltage is defined as the peak amplitude of the repeating units of the waveform. The electrical energy processing unit is configured to produce processed electrical energy that has an initial current of at least 10 mA or 50 mA or 100 mA or 500 mA (rms or peak). The current is sufficient for substantial damage of the body, i.e. the stem of the plant as it travels therethrough.

Alternatively the electrical energy processing unit may be configured to generate processed electrical energy that is steady state (i.e. DC with a constant current). The steady processed electrical energy is suitable for killing a plant or at least attenuating plant growth, e.g. it comprises a current of at least 10 mA or 50 mA or 100 mA or 500 mA, e.g. it comprises a voltage of above 1 kV or more particularly within one of the following ranges: 1 kV to 30 kV; 2 kV to 20 kV; 2.5 kV to 17.5 kV.

The electrical energy processing unit is configured to produce processed electrical energy that has a power (i.e. the initial power when first applying the electrical energy to a plant) of at least 5 W or 10 W or 50 W or 100 W. The electrical energy processing unit is configured to produce processed electrical energy that is operable to kill a plant or at least attenuate plant growth with a treatment time of at least 0.5 or 10 or 100 milliseconds.

The electrical energy processing unit is configured to produce processed electrical energy to kill a plant (e.g. immediate destruction of the plant such that the plant does not grow back) or at least attenuate the growth of a plant (e.g. such that the natural growth of a plant is substantially reduced).

The signal generator of the electrical continuity system may be configured to generate a continuity signal that is non-steady and comprises a waveform with a frequency (e.g. AC or DC). The said frequency may be 20 Hz-200 kHz. The waveform may be a periodic or aperiodic waveform, i.e. a waveform that continuously repeats with the repeating units therein having a constant or a varying period, e.g. a pulsed wave with a fixed duty cycle or a varying duty cycle. The shape of the repeating unit may be one of or a combination of one or more of the following forms: sine wave; saw-tooth wave; triangular wave; square wave; pulsed, e.g. DC pulsatile, half-wave rectified; full-wave rectified; other known form. The exact shape of the repeating unit may be an approximation of one of the aforesaid forms for reasons of distortion, e.g. overshoot/undershoot and the associated ringing and settle time. The repeating unit may be positive or negative or a combination thereof with respect to a reference value, which is typically 0 V. To generate the non-steady continuity signal the signal generator may comprise: pulse width modulator (PWM); an arbitrary waveform generator (AWG); function generator; other suitable signal generator, which may be controlled by the control circuit (that may comprise a processor).

Alternatively the signal generator of the electrical continuity system may be configured to generate a continuity signal that is steady state (i.e. DC with a constant current). To generate the said steady continuity signal the signal generator may comprise the control circuit (that may comprise a processor) controlling a DC to DC converter, such as a switch mode converter or other suitable power converter.

The steady and non-steady continuity signal is suitable for transmission around a continuity circuit comprising the continuity electrodes. The continuity signal may comprise a voltage of 1 Vrms-1000 Vrms or 1 Vrms-100 Vrms. In the example of a DC signal it may be 1 V-100 V or 1 V-1000 V. A higher voltage, e.g. above 100 Vrms/V, is generally applied when the continuity electrodes are incorporated in the applicator and/or earth electrodes, e.g. due to this high resistance of a plant in the circuit. The continuity signal may comprise a current of 0.1 mA-100 mA (rms or peak) for a DC or AC signal.

Generally the continuity signal comprises a frequency that is different to the frequency of the processed electrical energy or the continuity signal may be steady, to enable it to be at least partially filtered from the processed electrical energy by the signal processing arrangement. The difference in frequency may be: at least 50%; or an octave; or decade greater or lower, for example: for a processed electrical energy of 50 Hz, the continuity signal can be 500 Hz or 5 kHz i.e. one or two decades higher respectively; for a processed electrical energy of 25 kHz, the continuity signal 102 can be 250 Hz i.e. two decades lower. In another non-limiting example, the processed electrical energy is steady and the continuity signal is non-steady. A steady continuity signal and steady processed electrical energy are mutually exclusive.

Alternatively, the frequency of the continuity signal and processed electrical energy can be the same or similar, but with different shaped waveforms, e.g. two different waveforms selected from a list comprising: sine wave; saw-tooth wave; triangular wave; square wave; pulsed; a combination of one or more of the aforesaid waveforms, wherein the said waveforms can be at least partially filtered from each other based on their form.

The control circuit may be operable to determine the electrical continuity by measuring the electrical continuity and applying the electrical energy as a function of said continuity, e.g. as a multiple thereof. The control circuit may be operable to determine the electrical continuity by measuring the electrical continuity and by comparing it to a predetermined condition. In certain non-limiting embodiments, if the predetermined condition is satisfied then the control circuit enables the transmission of the processed electrical energy between the applicator electrode and earth electrode and/or if the predetermined condition is not satisfied then the control circuit prevents the transmission of the processed electrical energy between the applicator electrode and earth electrode. More particularly, the comparing the measured electrical continuity to a predetermined condition may comprise comparing the determined electrical continuity to a reference value, e.g.: if compared to a reference value the measured electrical continuity is above the reference value (high electrical continuity) then the processed electrical energy is enabled for transmission; if compared to a reference value the measured electrical continuity is below the reference value (low electrical continuity) then the processed electrical energy is prevented from transmission (or the converse of the conditions). The reference value may be stored on a memory unit of a processor, which may be the processor of the electrical energy processing unit. Alternatively an analogue voltage reference may be used as the reference value, e.g. when using an analogue comparator. The enabling of the processed electrical energy may comprise the output from the control circuit of a switching signal to effect switching on and/or maintaining on of the processed electrical energy. The preventing of the processed electrical energy may comprise the output from the control circuit of a switching signal to effect switching off and/or maintaining off of the processed electrical energy. The electrical continuity system may comprise or utilise a switching unit arranged to enable or prevent said transmission of the processed electrical energy, the switching unit being controlled by the control circuit. The switch unit may comprise an electrically operated switch such as a transistor and/or a relay.

Determining the electrical continuity using the continuity signal may comprise the control circuit configured to measure an aspect of the transmitted continuity signal, such as: voltage; phase; current; power; shape of waveform. In such an example a suitable predetermined condition can be a reference value of the said aspect.

Determining of the electrical continuity using a property related to the continuity signal may comprise the control circuit configured to measure an electrical potential to maintain the continuity signal with a constant current through the electrical continuity circuit. In such as example the signal generator may comprise a constant current source to provide a continuity signal with a constant current and the electrical control circuit is operable to measure the electrical potential over the constant current source to maintain the said constant current. In such an example a suitable predetermined condition can be a reference value of the electrical potential Determining the electrical continuity using the continuity signal may comprise: the signal generator configured generate a continuity signal that encodes information; the control circuit operable to determine electrical continuity by, for a transmitted continuity signal, decoding and authenticating said information. The information may be encoded as a characteristic of one or more waveforms (e.g. a particular shape of wave form or a particular period of one or more waveforms) and/or as a series of pulses of one or more waveforms. The decoding may comprise linear regression or other suitable data processing technique, which is implemented on a processor, which may be the processor of the electrical energy processing unit. Authenticating may comprise comparing the decoded information to information stored on a memory unit of the processor. In such an example a suitable predetermined condition can be the said authentication, e.g. whether the decoded information sufficiently corresponds to that stored.

The signal processing arrangement may be configured to prevent the processed electrical energy from interfering with the determination of the electrical continuity, e.g. by least partially isolating the transmitted continuity signal from the processed electrical energy. The signal processing arrangement may comprise one or more first filters arranged in series with a continuity determining portion of the electrical continuity system, e.g. the signal generator and/or control circuit (e.g. but not in series with a converter unit of the converter), the first filters being configured to allow passing of at least part of the continuity signal and to prevent the passing of at least part of the processed electrical energy.

The signal processing arrangement may be configured to prevent at least part of the continuity signal being transmitted around a circuit other than the continuity circuit, e.g.: such that it does not travel along the same circuit as the processed electrical energy; such that a part of the circuit of the processed electrical energy is at least partially isolated from the continuity signal, whereby the said part may comprise a convert unit of the converter. The signal processing arrangement may comprise one or more second filters arranged in series with a converter unit (e.g. in particular a secondary a winding of a transformer converter unit) of the converter, the second filters being configured to prevent the passing of at least part of the continuity signal (and to allow passing of the processed electrical energy). Advantageously, the second filters may filter any noise in the processed electrical energy that corresponds to the continuity signal.

The electrical energy processing unit may comprise a converter configured to receive unprocessed electrical energy from an electrical energy source, to convert the unprocessed electrical energy to processed electrical energy and to output said processed electrical energy to an applicator unit. Typically the converter is configured to transmit the said processed electrical energy between an applicator electrode of an applicator unit and an earth electrode of an earth unit. More particularly converter may be configured to transmit the processed electrical energy through a processed electrical energy circuit. The processed electrical energy circuit may comprise: an applicator electrode of an applicator unit; an earth electrode of an earth unit; in use a treated plant and the ground.

The electrical energy processing unit may comprise a control circuit (e.g. the control circuit of the electrical continuity system or a further control circuit) operable to control the converter to convert the unprocessed electrical energy to the processed electrical energy. In an example wherein the converter provides a fixed operation on the unprocessed electrical energy it will be appreciated that a control circuit is not required. However, generally the electrical energy processing unit comprises a control circuit when control of the said converter is required, e.g. to provide a varying output of an aspect, (e.g. voltage, current or power) of the processed electrical energy. The control circuit generally controls the converter by means of a control signal. The form of the processed electrical energy may generally correspond to that defined by the control signal (e.g. for a non-steady AC or DC waveform) but may be an approximation thereof for reasons of distortion. The control aspect of the control circuit may be a simple function, e.g. on/off of the processed electrical energy. In a more sophisticated example the control aspect may be the control of one or more of a list comprising the following aspects of the of the processed electrical energy: form; duty cycle, which is typically in the range of 0.05-0.45 (e.g. for a pulsed waveform); amplitude (e.g. to maintain the peak voltage at a particular magnitude for varying load); frequency; period; current; power; shape; other aspect. Typically the control circuit comprises a processor. The configuration of the control circuit may vary depending on the configuration and mode of operation of the converter. The control circuit may further be operable to control operation of one or more of the; applicator unit; earth unit; electrical energy source, e.g. by an electrical energy source feedback and control signal. The control circuit may further comprise a user interface operably connected to the processor for control of the operation of the processor and/or for monitoring of the operation of one of more of a list comprising the following: electrical energy processing unit; applicator unit; earth unit; electrical energy source. Alternatively, there is no user interface, e.g. the control circuit is operated automatically in response to an applied current from the electrical energy source.

The converter is configured to convert the unprocessed electrical energy to the desired form of processed electrical energy e.g. via conversion of one or more of the: voltage; current; frequency; other optional aspects to derive its desired form, i.e. for steady or non-steady processed electrical energy.

When generating steady processed electrical energy the converter typically increases the voltage. To generate the said steady processed electrical energy optionally a control circuit of the electrical energy processing unit may comprise a processor and may control a DC to DC converter, such as a switch mode converter or other suitable power converter.

When generating non-steady processed electrical energy the converter may comprise a converter unit which may have various configurations depending on its mode of operation, e.g.: the converter converts only frequency (e.g. the unprocessed electrical energy is supplied at the desired voltage) and the converter unit comprises an electrically operated chopper switch, the switch arranged in series with the unprocessed electrical energy; the converter converts only voltage (e.g. the unprocessed electrical energy is supplied at the desired frequency) and the converter unit comprises a variable or non-variable transformer. In further examples the converter unit may comprise a charge pump or boost converter, or other suitable electrical component.

Generally when generating non-steady processed electrical energy the converter increases the voltage and applies the desired frequency, e.g. the unprocessed electrical energy is of a lower voltage than the processed electrical energy and has a direct current. In such an example the control circuit of the electrical energy processing unit may comprise a waveform generation unit and a processor. The waveform generation unit is configured to generate a control signal comprising a waveform signal, e.g. the processor is configured to control the converter via the waveform generation unit (and other associated components when present). The waveform signal generally comprises a non-steady AC or DC signal that is representative of the waveform of the processed electrical energy, e.g. is it amplified by the converter to derive the required form of the processed electrical energy. The waveform of the waveform signal may be controlled by the processor in terms of its: form; duty cycle, which is typically in the range of 0.05-0.45 (e.g. for a pulsed waveform); on/off; amplitude (e.g. to maintain the peak voltage at a particular magnitude for varying load); frequency; period; current; power; shape; other aspect, e.g. to control the processed electrical energy in one of the aforesaid manners. The processor and waveform generator may be an integrated unit, e.g. an integrated circuit, or separate units in communication via a control signal. Generally the waveform generation unit is part of the aforesaid control circuit that comprises the processor. However, waveform generation unit may comprise an electronic component operable to generate a fixed waveform output, e.g. with no input other than an electrical energy supply. For example it may comprise any suitable signal generator that may be arranged as an integrated circuit. In such an example the processor may be obviated. In such an example the converter may comprise a switching unit and a converter unit. The switching unit may comprise one or more electrically operated switch, the said switch to receive the control signal and to switch therewith the unprocessed electrical energy. The electrically operated switch can be a transistor or a relay or other suitable component. In such an example the converter unit may comprise a transformer. The transformer may be arranged with the switched unprocessed electrical energy through a primary winding thereof and the processed electrical through a secondary winding thereof. In such an example the converter unit may comprise another suitable electrical component such as a charge pump or boost converter.

Disclosed herein according to a second non-limiting aspect of the present disclosure there is provided a method to electrically kill a plant or at least attenuate plant growth using the apparatus according to any feature of the first aspect. The method comprising: transmitting electrical energy, which is typically processed to the desired form, between an applicator electrode of an applicator unit and an earth electrode of an earth unit (e.g. typically including through the ground); transmitting a continuity signal to or in operational proximity to one or both of the said electrode(s); isolating using a signal processing arrangement at least part of the continuity signal from the processed electrical energy; determining, using said isolated continuity signal or a property related thereto, an electrical continuity between the ground and one or both of the said electrodes; controlling, using said determined electrical continuity, the transmission of the processed electrical energy.

The method may comprise encoding information with the continuity signal (e.g. using the signal generator); determining said electrical continuity by decoding and authenticating the encoded information (e.g. using the control circuit, and in particular information stored on a memory unit).

The method may comprise determining electrical continuity by measuring the electrical continuity and by comparing it to a predetermined condition. The method may comprise enabling the transmission of the processed electrical energy between the applicator electrode and earth electrode if the predetermined condition is satisfied; and/or preventing the transmission of the processed electrical energy between the applicator electrode and earth electrode if the predetermined condition is not satisfied.

The method may comprise applying processed electrical energy with a frequency that is at least 50% or an octave or decade greater or lower than that of the continuity signal.

Disclosed herein according to a third non-limiting aspect of the present disclosure there is provided a method to electrically kill a plant or at least attenuate plant growth using the apparatus according to any feature of the first aspect. The method may be combined with any feature of the second aspect. The method may comprise on start-up of the apparatus: transmitting the continuity signal (e.g. without transmission of the processed electrical energy); determining an electrical continuity between the ground and one or both of the said electrodes; if continuity is determined then the processed electrical energy is first transmitted else processed electrical energy is not transmitted. If continuity is determined then thereafter the continuously the continuity can be determined and the processed electrical energy can be controlled as for the second aspect.

The above non-limiting aspects of the present disclosure may be combined in any suitable combination. Moreover, various features herein may be combined with one or more of the above aspects to provide combinations other than those specifically illustrated and described. Further non-limiting aspects and advantageous features of the present disclosure will be apparent from the claims, from the detailed description, and annexed drawings.

The following describes a single general embodiment apparatus to which the various described embodiment features can be added without limitation, including those described herein above.

FIG. 1 shows a block diagram of an exemplary abstraction of electrical apparatus 2 to control plant growth according to the present disclosure. The apparatus 2 can be suitably adapted for applications wherein large areas of plants are required to be treated, for example, applications in an agricultural environment or commercial environments (such as golf courses or sports pitches). Equally, it can be adapted for applications wherein smaller areas of plants are required to be treated, for example, private non-commercial use in the treatment of a garden of a home user. The apparatus 2 may be considered to comprise at a first level thereof: an electrical energy source 4; a processed electrical energy circuit 20; an electrical energy processing unit 6, a processed electrical energy circuit 20, which are described sequentially.

Electrical Energy Source

Figure 2:
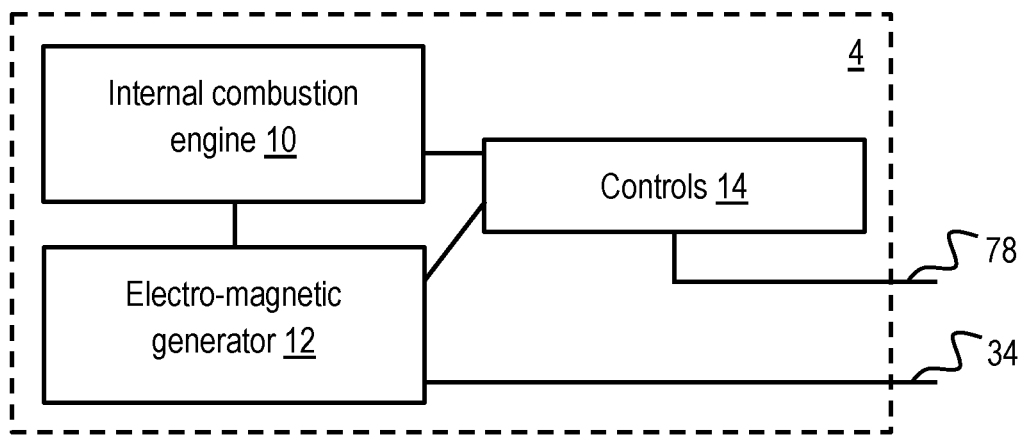
FIG. 2 is a block diagram of a first embodiment of an electrical energy source of the apparatus of FIG. 1.

The electrical energy source 4 is operable to provide unprocessed electrical energy to the electrical energy processing unit 6 for conversion to processed electrical energy 36. The unprocessed electrical energy 34 may comprise any kind of electrical energy, such as a: direct current (DC), e.g. 12 V-24 V; or an alternating current (AC), e.g. 110 Vrms-240 Vrms at 50-60 Hz. The electrical energy source 4 may be fully or partially controlled by the electrical energy processing unit 6 e.g. by means of open-loop control, or by means of closed-loop control, which comprises using an electrical energy source feedback and control signal to control and monitor aspects of the unprocessed electrical energy 34, e.g. the voltage and/or current and/or frequency by means of sensors, which is discussed in more detail further on. Alternatively the electrical energy source 4 has a separate control system, which comprises a user interface, such as actuators and/or a dedicated control system. The electrical energy source 4 can be arranged integrated with or discrete from the electrical energy processing unit 6. Moreover, the electrical energy source 4 may be arranged to supply one or more electrical energy processing units 6, which are commonly or independently controlled. Accordingly, it will be appreciated that the electrical energy source 4 may comprise various means, examples of which are discussed:

In FIG. 2 shows in block form a particular (but non-limiting) first embodiment of the electrical energy source 4, which is applicable to agricultural or home environments. Herein an engine-generator comprises an internal combustion engine 10 and an electro-magnetic generator 12. The engine 10 provides rotational energy to a rotor of the generator 12 that is configured to convert the rotational energy in to the unprocessed electrical energy 34, which is in turn supplied to the electrical energy processing unit 6.

The engine-generator further comprises controls 14 operable to control as input the engine 10 and/or generator 12. For example, the controls 14 may be operable to control one or more of the following input operational parameters of the engine 10: start-up/shut-down; angular velocity (of the rotor or engine); other operational parameters such as choke, and a disconnect switch of the generator 12. The controls 14 may comprise manual (for example, actuators) and/or automated means (for example, electrically operated actuators). Automated controls 14 are, in certain non-limiting embodiments, controlled by the electrical energy processing unit 6. Control may be open-loop or closed-loop: e.g. the automated controls are controlled by means of an electrical energy source feedback and control signal 78 provided from sensors of the engine-generator such that if a difference between the output of a particular operation parameter and an associated reference value is a certain amount then the input is changed accordingly. The electrical energy source feedback and control signal 78 may comprise information relating to aspects of the engine-generator, such as one of more of the following: angular velocity; choke; oil level/temperature; water level/temperature; other operational parameters.

Figure 3:
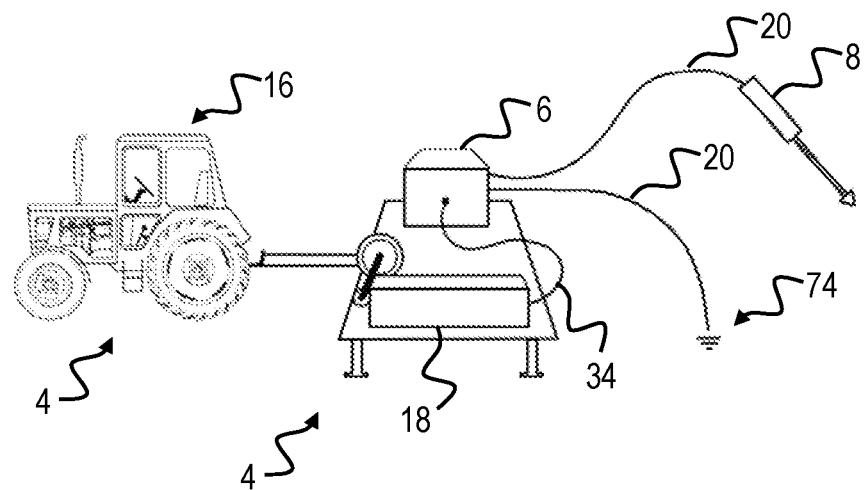
FIG. 3 is an illustrative diagram of a second embodiment of the electrical energy source of FIG. 1.

In FIG. 3 a second embodiment of an electrical energy source 4 is shown, which is suited to agricultural environments. Herein the electrical energy source 4 comprises a vehicle 16, such as a vehicle adapted for agricultural use (e.g. a tractor), which provides rotational drive from a power take-off shaft to a rotor of an electro-magnetic generator 18. Typically the power take-off shaft rotates at 540 rpm, and via a drive train drives the rotor to rotate at 1500-1800 rpm. The electro-magnetic generator 18 is configured to convert the rotational energy to the unprocessed electrical energy 34, which is in turn supplied to the electrical energy processing unit 6 for processing. Typically the electrical energy supplied from the electro-magnetic generator 18 has 110 Vrms-240 Vrms at 50-60 Hz. The electro-magnetic generator may be integrated as part of the vehicle, and thus the vehicle generates the unprocessed electrical energy 34.

In a third embodiment the electrical energy source 4 comprises a battery or a fuel cell. In this embodiment the unprocessed electrical energy 34 that is supplied to the electrical energy processing unit 6 is a direct current. An example of a suitable battery is a 12 V-24 V unit as used in the automotive industry. This embodiment is applicable to agricultural or home environments.

In a fourth embodiment the electrical energy source 4 comprises an AC line supply, such as a mains supply of a commercial or domestic property. Accordingly, the line supply may be 110-120 Vrms AC or 220-240 Vrms AC at 50-60 Hz. This embodiment is applicable to agricultural or home environments.

Processed Electrical Energy Circuit

The processed electrical energy circuit 20 comprises a circuit to transmit the processed electrical energy from the electrical energy processing unit 6. The circuit comprises electrodes of the applicator unit 8 and earth unit 74 and in use a treated plant and the ground. The applicator unit 8 and earth unit 74 will be described sequentially.

Applicator Unit

The applicator unit 8 is configured to receive processed electrical energy 36 from the electrical energy processing unit 6 and to transmit said electrical energy to one or more plants, such as (but not limited to) by means of direct contact therewith.

The applicator unit 8 comprises one or a plurality of applicator electrodes, wherein the/each applicator electrode is configured to apply the processed electrical energy 36 to the/each plant, such as (but not limited to) via direct contact therewith. In an example comprising a plurality of applicator electrodes the applicator electrodes may be arranged in series or in parallel or a combination thereof with respect to the received electrical energy. Moreover, the electrical energy processing unit 6 may supply a separate electrical energy output for each or a group (i.e. 2 or more) of the plurality of applicator electrodes, for example, there is a separate transformer or transformer winding for each or the group of applicator electrode. In a similar fashion a single electrical energy processing unit 6 may supply one or a plurality of applicator units 8, e.g. the applicator units 8 are arranged in series or in parallel or a combination thereof with respect to the received electrical energy or the electrical energy processing unit 6 has a separate electrical energy output for each applicator unit 8.

The applicator electrode comprises an electrically conductive material e.g. copper, zinc, bronze, brass, aluminium or steel. The applicator electrode may further comprise an insulating dielectric material, which is operable to conduct the processed electrical energy 36 by capacitive action, such as an alumina or other ceramic, e.g. alumina or porcelain or a plastic such as Perspex®. The dielectric material is arranged with respect to the electrically conductive material such that a treated plant receives the processed electrical energy 36 substantially or entirely via the dielectric material, e.g. an entire outer surface of the electrically conductive material is coated with the dielectric material or an exposed outer surface is coated. Typically, the dielectric material of the applicator electrode is a layer or coating, which is 0.5-2.5 mm thick. Advantageously, the dielectric material acts to reduce arcing. Moreover, the processed electrical energy 36 in the conductive material of the applicator electrode can be prevented from being in direct contact with a user. The processed electrical energy 36 can be effectively conducted through the dielectric material at the high-frequency, i.e. above 18 kHz, or more particularly above 20 or 25 or 40 or 50 kHz.

Figure 4:
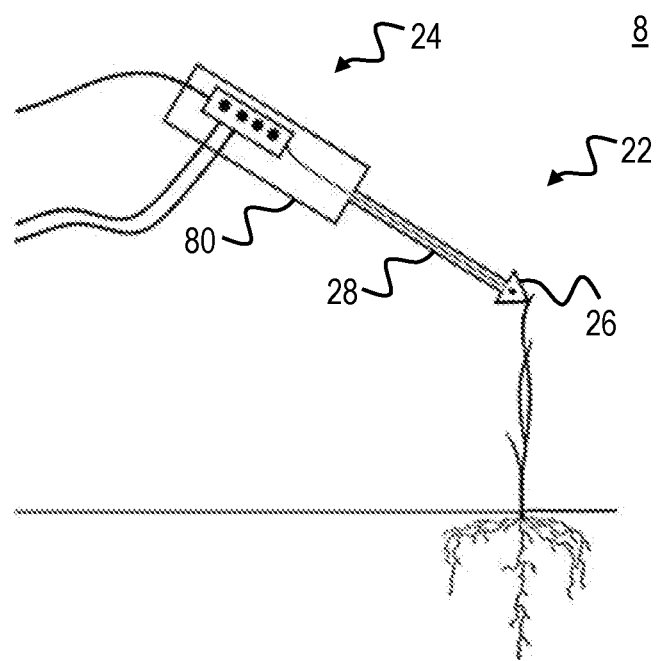
FIG. 4 is an illustrative diagram of a first embodiment of an applicator unit of the apparatus of FIG. 1.

In view of the above, it will be appreciated that the applicator unit 8 may comprise various arrangements. Embodiments with applicator unit(s) adapted for wide area coverage (e.g. by means of one or a combination of the following: numerous applicator units; numerous applicator electrodes; applicator units with electrodes for wide-area coverage) are suited to agricultural or commercial applications. Likewise, embodiments with applicator unit(s) adapted for small area coverage (e.g. by means of one or a combination of the following: single applicator units; single or multiple applicator electrodes; electrodes with small-area coverage) are suited to private non-commercial applications. Wide area coverage can be defined as comprising a ground treatment area of 50 cm$^2$ or 1 m$^2$ or more. Small area coverage can be defined as individual plants or a ground treatment area of up to 5 cm$^2$ or up to 10 cm$^2$. Examples of various applicator units 8 are discussed:

In FIG. 4 a first embodiment of an applicator unit 8 is illustrated, which is generally applicable to private non-commercial environments. Herein the applicator unit 8 comprises an application head 22 and a body 24, which are described sequentially.

The application head 22 is for transmission of the electrical energy to a plant, and to this end comprises the applicator electrode 26 for direct contact therewith. The applicator electrode 26 can be shaped with various configurations, which are selected for the intended treatment regimen, for example: a rod for sweeping through areas of dense plants; a hook-shape for separating plants. The applicator electrode may be substantially rigid or compliant such that it is displaced during treatment.

The body 24 is for: connection of the applicator unit 8 to a chassis of the apparatus 2 in an example wherein the applicator unit 8 is fixed to a chassis of the apparatus; holding by a user in an example wherein the applicator unit 8 is discrete from a chassis and is movable independently therefrom. To this end the body 24 may comprise a connection/holding portion 80 and an extension portion 28. The connection/holding portion 80 is for said connection/holding of the applicator unit 8. The extension portion 28 provides an extended position of the head 22 with respect to the connection/holding portion 80 for convenience of use. At a proximal end of the extension portion 28 is arranged the connection/holding portion 80 and at a distal end is arranged the head 22. In certain non-limiting embodiments, the connection/holding portion 80 and extension portion 28 are made of an insulating material, such as a ceramic or plastic or rubber. Hence the extension portion 28 safely bridges the distance between the connection/holding portion 80 and the head 22. In the example wherein the applicator unit 8 is intended for holding by a user, the applicator unit 8 may have connected thereto a part of or all of a user interface (discussed later on), accordingly one or more of the features controlled by a user via the user interface may be controlled at the applicator unit 8.

Figure 5:
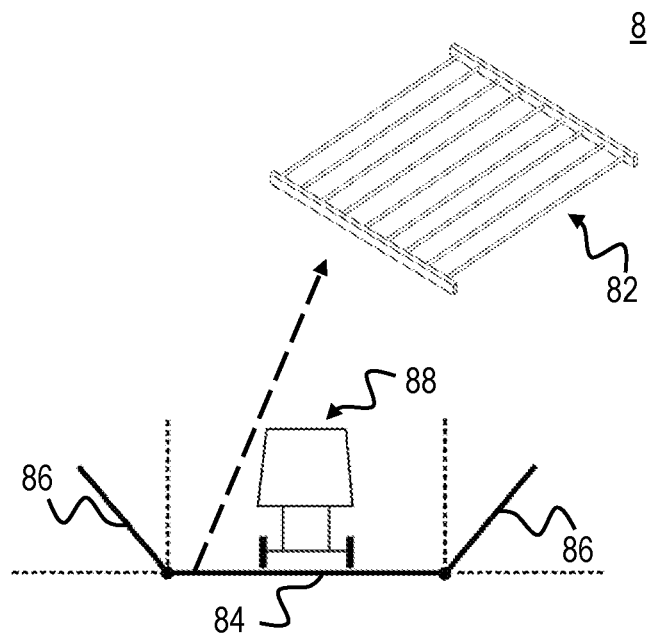
FIG. 5 is an illustrative diagram of a second embodiment of the applicator unit of FIG. 1.

In FIG. 5 a second embodiment of an applicator unit 8 is illustrated, which is generally applicable to agricultural environments. Herein the applicator unit 8 comprises a frame 82, which as shown may be formed of lateral and transverse members. The frame as shown may comprise a central portion 84 and first and second side portions 86. The side portions 86 can be pivotally or telescopically connected to the central portion such that they can be moved between an operating position and a stowed position for transit. The frame 82 can be supported by an agricultural vehicle 88, such as a tractor or a trailer. With such an example a suitable size is: 3 m×1.2 m in width and length respectively for the central portion; 1.5 m×1.2 m in width and length respectively for the side portions. The frame 82 is typically formed from an electrically conductive material, e.g. a metallic material such as steel. In this way the frame 82 in itself comprises the applicator electrode 26. In certain non-limiting embodiments, the electrically conductive material is hollow e.g. tube with a diameter of 12 mm.

Earth Unit

The earth unit 74 is configured to receive the processed electrical energy 36 from the applicator unit 8 via a plant and the earth, and is connected to the electrical energy source 4, generally via the energy processing unit 6 to provide a return path for the components therein and to complete a circuit that has a load comprising a treated plant and the earth. In use it may be desired (although not by way of limitation) that the earth electrode is arranged proximate the applicator unit 8 to reduce power loss into the earth (and for electrical safety). In a similar fashion to the applicator unit 8, the earth unit 74 may have connected thereto a part of or all of a user interface 42. Accordingly one or more of the features controlled by a user via the user interface may be controlled at the earth unit 74.

The earth unit 74 comprises an earth electrode 76 of electrically conductive material configured for electrical continuity with the ground. The earth unit 74 may comprise one or a plurality of said electrodes 76 which may be connected to each other. The earth electrode comprises an electrically conductive material, such as a metal e.g. copper, zinc, bronze, brass, aluminium or steel. Typically, the earth electrode 76 is 0.5-20 mm thick depending of the application and specific shape, e.g.: a 10-20 mm diameter rod or a 0.5-20 mm thick plate for the respective first and second embodiments:

In a first embodiment of the earth unit the earth electrode is in the form of an implement, which is configured to provide the return path when inserted into the ground, for example the earth electrode is formed as a spike or rod.

Figure 14:
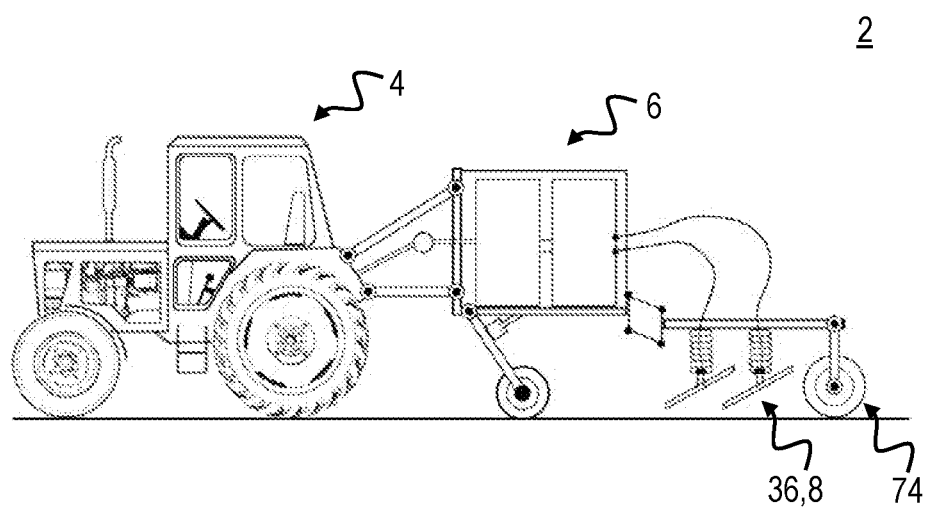
FIG. 14 is an illustration of the electrical weed killing apparatus of FIG. 1 adapted for use in an agricultural environment.

In a second embodiment of the earth unit the earth electrode 76 is configured to provide a return path when resting on the ground. Generally, the earth electrode comprises a large surface area to aid electrical transmission. The earth electrode may comprise a substantially flat outer surface configured to stably rest against the ground, such as a plate or other suitable shape, e.g.: a circular plate, which may have diameter of 10-20 cm; a square plate, which may have a side length of 10-20 cm. Alternatively the earth electrode may comprise (or be arranged around an outer periphery of) one or more rotary members, such as a wheel or roller, which is configured to rotate along the ground as the apparatus 2 is moved (such an example is shown in FIG. 14).

The earth electrode of the first or second embodiment may further comprise an insulating dielectric material, which is operable to conduct the processed electrical energy 36 by capacitive action, such as an alumina or other ceramic, e.g. alumina or porcelain or a plastic such as Perspex®. The dielectric material is arranged with respect to the electrically conductive material such that the electrically conductive material receives the processed electrical energy 36 substantially or entirely via the dielectric material, e.g. an entire outer surface of the electrically conductive material is coated with the dielectric material or an exposed outer surface (that is to be inserted in or rest on the ground for the respective embodiments) is coated and optionally a rim adjacent thereto. Typically, the dielectric material of the earth electrode is a layer or coating, which is 0.5-2.5 mm thick. Advantageously, the processed electrical energy 36 in the conductive material of the earth electrode is prevented from being in direct contact with a user.

The second embodiment of the earth unit is particularly suited for use with an electrical energy processing unit 6 that produces processed electrical energy 36 waveforms with a frequency in the range of above 18 or 20 or 25 or 40 or 50 kHz. This is because the processed electrical energy 36 of this frequency can be relatively efficiently transmitted from the ground to the earth electrode without the need for insertion into the ground. As the frequency is increased the efficiency of the earth electrode in receiving the processed electrical energy 36 increases such that it may be made smaller and/or in embodiments that comprise the dielectric material the thickness thereof increased.

The second embodiment earth unit is advantageous in comparison to the first embodiment earth unit when, for example, treating plants at a first location and a distant second location: the earth electrode of the first embodiment earth unit requires extraction from the ground at the first location and insertion into the ground in operational proximity to the second location; comparatively the earth electrode of the second embodiment earth unit can be displaced from the first location to the second location by sliding or rolling it along the ground, thus obviating the steps of extraction and insertion. This functionality is particularly useful for applications wherein large areas of plants are required to be treated, for example, applications in an agricultural environment, wherein the apparatus 2 may be mounted to a vehicle driven system that is continuously is moved over the ground. Moreover, when treating certain ground, such as tarmac or hard-packed stone, it may not be possible to insert the first embodiment earth unit into the ground, and thus achieve adequate earth continuity. However, adequate earth continuity may still be achieved with the second embodiment earth unit since insertion is not essential.

The second embodiment earth unit when comprising an outer layer of insulating dielectric material, in comparison to the first embodiment earth unit, may be less effective in receiving the processed electrical energy 36 since the said capacitive action results in a slight voltage drop, however this can be compensated by increasing the voltage of the processed electrical energy 36.

Apparatus 2 to electrically control plant growth which use the second embodiment earth unit may be combined with other configuration applicator units, e.g. those that transmit the processed electrical energy to a plant not by direct contact therewith such as a spark transmission system as disclosed in JP H3-83534, and the related publication: 'Destruction of Weeds by Pulsed High-Voltage Discharges', A. Mizuno, T. Tenma and N. Yamano, Toyohashi University of Technology, 1990.

Electrical Energy Processing Unit

The electrical energy processing unit 6 is configured to: receive the unprocessed electrical energy 34, from the electrical energy source 4; process the unprocessed electrical energy 34 to the processed electrical energy 36; supply the processed electrical energy 36 between the applicator unit 8 and earth unit 74 for transmission to a plant. In general the aforesaid processing comprises processing to achieve the desired form of processed electrical energy 36, e.g. via conversion one or more of the: voltage; current; frequency; other optional aspects of the waveform.

The processed electrical energy 36 may comprise a periodic or aperiodic waveform, i.e. a waveform that continuously repeats with the repeating units therein having a constant or a varying period, e.g. a pulsed wave with a fixed duty cycle or a varying duty cycle. The shape of the repeating unit may be one of or a combination of one or more of the following forms: sine wave; saw-tooth wave; triangular wave; square wave; pulsed, e.g. DC pulsatile, half-wave rectified; other known form. The exact shape of the repeating unit may be an approximation of one of the aforesaid forms for reasons of distortion, e.g. overshoot/undershoot and the associated ringing and settle time. The repeating unit may be positive or negative or a combination thereof with respect to a reference value, which is typically 0 V.

Figure 6:
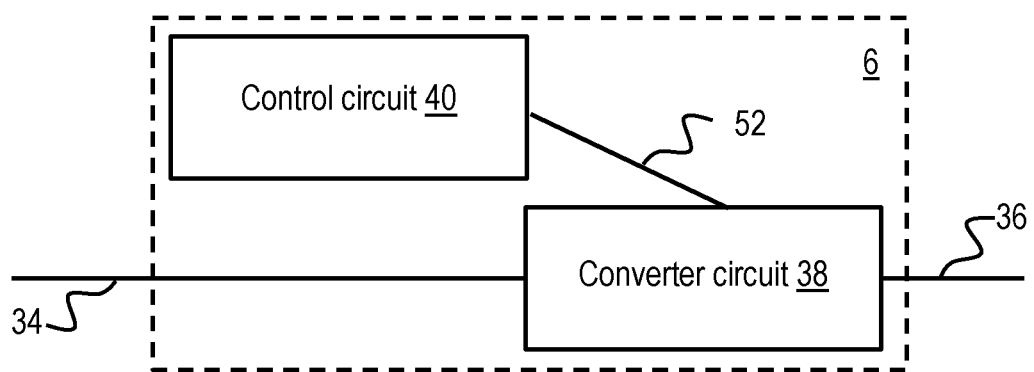
FIG. 6 is a block diagram showing an embodiment of an electrical energy processing unit of the apparatus of FIG. 1.

FIG. 6 shows a block diagram of the electrical energy processing unit 6 according to the present disclosure. The electrical energy processing unit 6 may be considered to comprise at a second level of the apparatus 2: an optional control circuit 40; a converter 38, which are described sequentially.

The control circuit 40 typically comprises a processor and user interface (examples of which are discussed following).

The control circuit 40 is operable to control, by means of a control signal 52 (which may be any suitable signal type, e.g. a digital, DC or AC signal), the converter 38 to convert the unprocessed electrical energy 34 to the desired form of processed electrical energy 36. The exact operation of the control circuit 40 depends on the conversion configuration of the converter 38, e.g.: in an example wherein the converter 38 is configured to convert only frequency (i.e. the unprocessed electrical energy 34 is supplied at the desired voltage) the control circuit 40 may supply a control signal to an electrically operated chopper switch of the converter 38, the switch arranged in series with the unprocessed electrical energy 34. Alternatively, in an example wherein the converter 38 is configured to convert only voltage and current (i.e. the unprocessed electrical energy 34 is supplied at the desired frequency and waveform) the control circuit 40 may supply a control signal to a variable transformer of the converter 38. Alternatively, the control circuit 40 may control via a control signal converter 38 that comprises a charge pump or boost converter or other suitable component.

In an example wherein the converter 38 provides a fixed operation on the unprocessed electrical energy (e.g. it comprises only a non-variable transformer for voltage and current conversion) it will be appreciated that a control circuit 40 may be obviated. However, generally the electrical energy processing unit 6 comprises a control circuit 40 when control of the said converter 38 is required.

Figure 7:
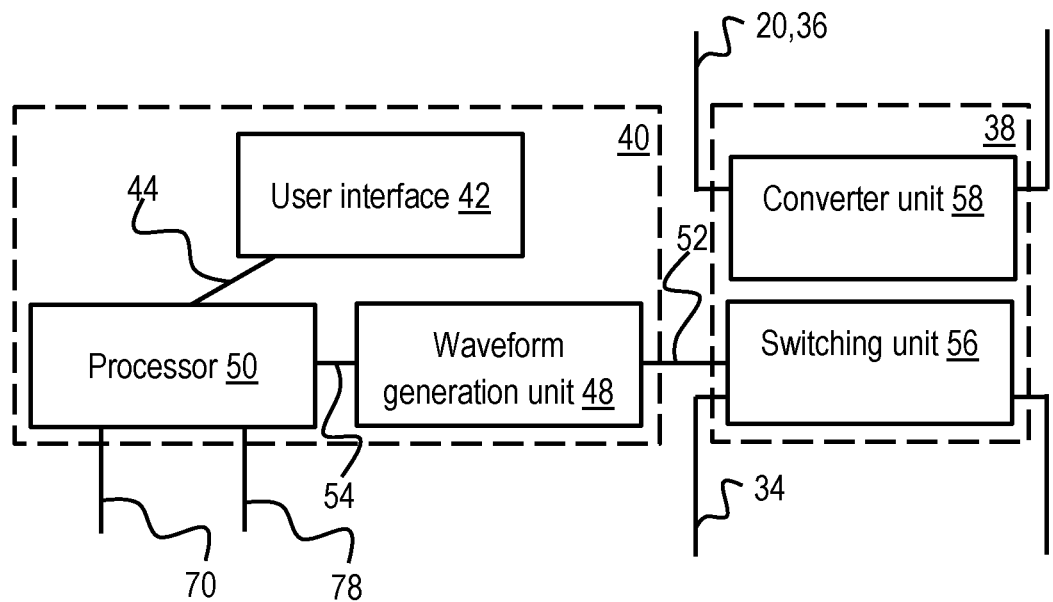
FIG. 7 is a block diagram showing an embodiment of a control circuit and a converter of the electrical energy processing unit of FIG. 6.

In a particular (but non-limiting) example, which is illustrated in FIG. 7, the control circuit 40 is operable to generate a control signal comprising a waveform signal 52; the converter 38 is operable to convert, using the said waveform signal 52, the unprocessed electrical energy 34 to processed electrical energy 36, which has a waveform that corresponds to that of the waveform signal 52. In the said particular (but non-limiting) example, the control circuit comprises: a waveform generation unit 48; an optional processor 50; an optional user interface 42, which are described sequentially.

The waveform generation unit 48 is operable to generate the waveform signal 52, which may have various forms that are repetitive and can be periodic or aperiodic, e.g. a pulsed wave with a fixed duty cycle or a varying duty cycle. The shape of the repeating unit of the waveform may be one of or a combination of one or more of the following forms: sine wave; saw-tooth wave; triangular wave; square wave; pulsed, e.g. DC pulsatile, half-wave rectified; other known form. Moreover, the waveform signal may be positive or negative or a combination thereof with respect to a reference value, which is typically 0 V. The waveform generation unit 48 may for example comprise: a pulse width modulator (PWM); an arbitrary waveform generator (AWG); function generator; other suitable signal generator. The waveform generation unit 48 may be separate to or integrated with the processor 50 i.e. as a peripheral thereof.

The processor 50 generally is operable to control the converter 38 by means of the control signal 52. In the particular (but non-limiting) example, which is illustrated in FIG. 7, the processor 50 is operable to control the waveform signal 52 via control of the waveform generation unit 48. In an example wherein the waveform generation unit 48 is configured to output a fixed waveform signal 52, the processor 50 can be obviated. Typically the processor 50 controls the form of the waveform of the processed electrical energy 36, e.g. via the form of the waveform signal 52, however the control element may be less sophisticated, e.g. on/off.

The processor 50 in a general example is operable to receive an input, for example, one or more of the following:

commands from the user interface 42 via a user interface signal 44; the electrical energy source feedback and control signal 78 from the electrical energy source 4; a converter feedback signal 70 from the converter 38; unprocessed electrical energy 34. The input is processed according to program code (and/or programmed logic) stored on a memory unit of the processor 50 to determine an output. The output may be control via the control signal 52, e.g. open or closed-loop control, of one or more of the following aspects of the processed electrical energy 36: form; duty cycle, which is typically in the range of 0.05-0.45 (e.g. for a pulsed waveform); on/off; amplitude (e.g. to maintain the peak voltage at a particular magnitude for varying load); frequency; period; current; power; shape; other aspect. In the particular (but non-limiting) example, which is illustrated in FIG. 7, the said control of the processed electrical energy 36 is typically via control of the corresponding waveform signal 52, e.g. via a control signal 54 to the waveform generation unit 48 and other associated units when present (such as a driver as discussed in the specific examples later on). The output may further be control of the unprocessed electrical energy 34 from the electrical energy source 4 by open-loop control or by closed-loop control by means of the electrical energy source feedback and control signal 78.

The processor 50 generally comprises memory, input and output system components, which are arranged as an integrated circuit, typically as a microprocessor or a microcontroller. The processor 50 may comprise other suitable integrated circuits, such as: an ASIC; a programmable logic device such as an FPGA; an analogue integrated circuit, such as a controller. For such devices, where appropriate, the aforementioned program code can be considered programmed logic or to additionally comprise programmed logic. The processor 50 may also comprise a plurality of the aforementioned integrated circuits. An example is several integrated circuits arranged in communication with each other in a modular fashion e.g.: a slave integrated circuit to control the user interface 42 in communication with a master integrated circuit to control the waveform generation unit 48.

The processor 50 generally comprises a memory unit for storage of the program code and optionally data. The memory unit typically comprises: a non-volatile memory e.g. EPROM, EEPROM or Flash for program code and operating parameter storage; volatile memory (RAM) for data storage. The memory unit may comprise a separate and/or integrated (e.g. on a die of the processor) memory unit. The processor 50 may be idealised as comprising a control unit and an arithmetic logic unit or a plurality thereof, i.e. multiple processors.

The user interface 42 comprises hardware to enable a user to interface with the processor 50, by means of a user interface signal 44. A user may be able to control one or more of the outputs of the processor 50 via the user interface, e.g. the said aspects of the processed electrical energy 36 including: optional high, medium and low power settings (e.g. low power may be 50% of the high power and medium power may be 75% of the high power); optionally a reset power setting. Moreover, in embodiments comprising a plurality of applicator units 8 and/or applicator electrodes 26, the aforementioned aspects of the processed electrical energy 36 may be controlled via the user interface 42 for the applicator units 8 and/or applicator electrodes individually or in groups. A user may further be able to control one or more of the following aspects of the electrical energy source 4/unprocessed electrical energy 34 via the user interface 42: on/off; voltage; current; other aspects that will depend on the particular embodiment of the electrical energy source 4.

The hardware of the user interface 42 may comprise any suitable device(s), e.g. one or more of the following: buttons, such as a joystick button; LEDs; graphic or character LDCs; graphical screen with touch sensing or screen edge buttons; on/off switch. The user interface 42 can be formed as one unit or a plurality of discrete units, and may be arranged remote from the other third level components of the control circuit 40, e.g. in apparatus 2 adapted for use in an agricultural environment it may be arranged in the cabin of an agricultural vehicle.

The user interface signal 44 is transmitted between the user interface 42 and the processor 50 by means of cabled media or wireless media or a combination thereof, e.g.: a wired connection, such as RS-232, USB, I²C, Ethernet define by IEEE 802.3; a wireless connection, such as wireless LAN (e.g. IEEE 802.11) or near field communication (NFC) or a cellular system such as GPRS or GSM. For more sophisticated media the processor 50 and user interface 42 can be operatively connected to (or comprises as a peripheral) the relevant communication interfaces. The processor 50 may be operatively connected to (or comprises as a peripheral) a web server or a network router and the user interface 42 may comprise a program such as a web browser executed by a communication device such as a: PDA; tablet; laptop; smartphone; PC; or other suitable device.

The components that comprise the control circuit 40 are typically powered by the unprocessed electrical energy 34 from the electrical energy source 4 following conversion to a suitable voltage, e.g. 10 V DC. They may alternatively be powered by a separate electrical energy source.

The converter 38 will now be discussed and, as illustrated in FIG. 6, is configured to: generally receive the control signal 52 from the control circuit 40; receive the unprocessed electrical energy 34 from the electrical energy source 4; convert, generally using the control signal 52, the unprocessed electrical energy 34 to the desired form, e.g. via conversion one or more of the: voltage; current; frequency; other optional aspects of the waveform; transmit said processed electrical energy 36 to the processed electrical energy circuit 20.

The converter 38 may have various configurations depending on its mode of operation, e.g.: in an example wherein the converter 38 converts frequency (i.e. the unprocessed electrical energy 34 is at the desired voltage) the converter 38 comprises a converter unit in the form of an electrically operated chopper switch, the switch arranged in series with the unprocessed electrical energy 34. Alternatively, in an example wherein the converter 38 converts voltage and current (i.e. the unprocessed electrical energy 34 is at the desired frequency) the converter 38 comprises a converter unit in the form of a variable or non-variable transformer. In further examples the converter unit may comprise a charge pump or boost converter, or other suitable electrical component.

Figure 8:
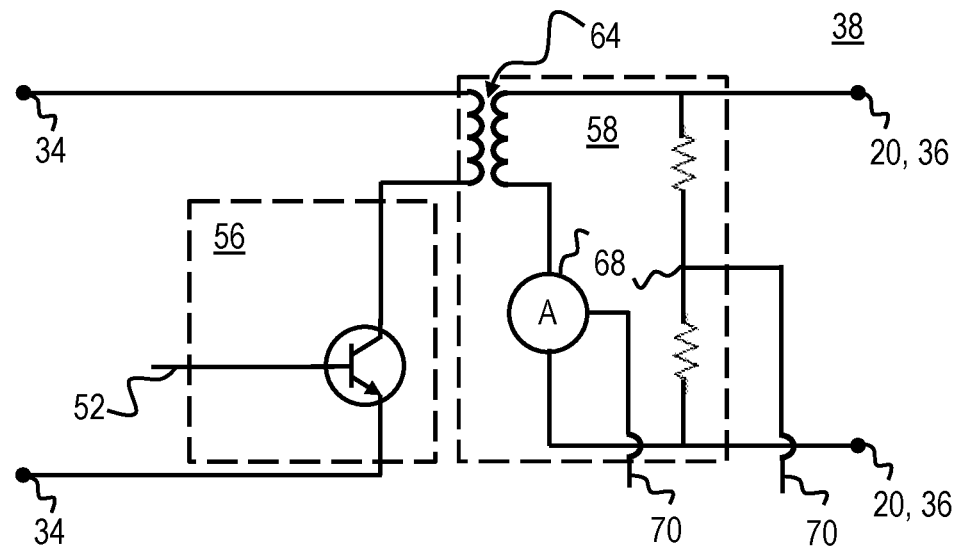
FIG. 8 is a schematic diagram showing an embodiment of a converter of the electrical energy processing unit of FIG. 6.

In the particular (but non-limiting) example, which is illustrated block form in FIG. 7 and schematically in FIG. 8, the converter 38 comprises: a switching unit 56; a converter unit 58, and is operable to convert voltage, current and frequency, and other optional aspects to derive the desired the waveform of the processed electrical energy 36. The switching unit 56 and converter unit 58 will be described sequentially.

The switching unit 56 is configured to receive the control signal 52 and, using the control signal 52, switch the unprocessed electrical energy 34 at a desired frequency through the converter unit 58. Accordingly, the switching unit 56 generally comprises an electrically operated switch, an example of which is one or more (e.g. a Darlington pair or other arrangement) transistor. The transistor is generally arranged with: a base connected to the control signal 52; an emitter grounded; a collector connected to the unprocessed electrical energy 34 via the converter unit 58, although various other arrangements are possible. Other forms of electrically operated switch may be used, such as a MOSFET, IGBT or relay.

The converter unit 58 is operable to receive the switched unprocessed electrical energy 34 and to transform its voltage to a desired magnitude to determine the processed electrical energy 36. Accordingly, the converter unit 58 generally comprises: a step-up transformer 64 having a primary winding arranged in series with the switched unprocessed electrical energy 34; a secondary winding arranged in series with the applicator unit 8 and earth unit 74, thereby defining a circuit comprise a treated plant.

The converter 38 may further comprise one or more sensor(s) 68 for monitoring and/or controlling aspects of the processed electrical energy 36, for example, the voltage and/or current. The sensor(s) 68 provide a converter feedback signal 70 (which may be any suitable signal type, e.g. a digital, DC or AC signal), to the processor 50, typically for closed-loop control. As an alternative to use in closed-loop control (or in addition) the converter feedback signal 70 may be stored on the memory unit so that it may subsequently be analysed.

The electrical energy processing unit 6 is typically configured to generate processed electrical energy 36 that has a waveform with a peak voltage in the range of 1 kV to 30 kV: it may be specifically configured, or user controllable to generate a waveform with any peak voltage therebetween. Generally, the voltage is about 4-8 kV.

The electrical energy processing unit 6 is typically configured to generate processed electrical energy 36 that has a waveform that repeats continuously with a frequency of 18 kHz to 5 MHz: it may be specifically configured, or user controllable to generate a waveform that repeats with any frequency therebetween. Generally, the frequency is about 20-75 kHz. Alternatively, the frequency may be lower, e.g. 50 Hz and above.

As electrical current flows through a plant, the plant can be killed by the current due to heat generated by the plant's resistance to electron flow. In more detail, as the current flows it damages the cellular structure of the plant and water is released. The increased water has the effect of reducing the resistance: this allows more current to flow so more damage is done, reducing the resistance still further, so more current flows and so on. The current therefore generally rises with time. The initial current required to kill a particular plant will vary considerably depending on the type of plant, its moisture content, and the moisture of the air, soil etc. The electrical energy processing unit 6 is typically configured to generate processed electrical energy 36 that has initial current of at least 10 mA, although typically a higher initial current is used.

The electrical energy processing unit 6 is typically configured to generate processed electrical energy 36 that has an initial power of at least 5 W. The initial power may vary depending on the embodiment of the electrical energy source 4 that the electrical energy processing unit 6 is configured to operate with, e.g.: for the first or second embodiment the initial power may be 3-6 kW for 3-5 kV; for the third embodiment the initial power may be 500-2000 W for 2.5-4 kV; for the fourth embodiment the initial power may be 2-3 kW for 2.5-4 kV. Generally for apparatus 2 intended for agricultural/commercial use the electrical energy processing unit 6 and electrical energy source 4 produce processed electrical energy 36 with an initial power of 10-60 kW at 5-20 kV. Generally for apparatus 2 intended for private non-commercial use the electrical energy processing unit 6 and electrical energy source 4 produce an initial power of 100-3000 W at 2-5 kV.

The electrical energy processing unit 6 is typically configured to generate processed electrical energy 36 that can kill a plant with a treatment time of at least 10 milliseconds. It will be appreciated that a small treatment time, such as 10 milliseconds will be applicable to small plants, whereas large plants will take longer, such as 5-6 seconds.

The processed electrical energy 36 may be controlled by the processor 50 in various ways, such as control over (or through) the load (comprising a treated plant and the earth) of the: voltage; current; power, examples of which will now be discussed.

The following examples of processed electrical energy 36 control may be applied to apparatus 2 that generate lower frequency processed electrical energy 36, such as processed electrical energy 36 with any voltage and frequency suitable for killing a plant, e.g. 50-60 Hz (as disclosed in U.S. Pat. No. 4,338,743) up to the above particular (but non-limiting) range (it will be appreciated that the above electrical energy processing unit 6 could be configured to produce this processed electrical energy, e.g. by generation of the appropriate control signal 52). Moreover, the control may be applied to apparatus 2 with other configuration applicator units, e.g. those that transmit the processed electrical energy to a plant without direct contact therewith, such as a spark transmission system as disclosed in JP H3-83534, and the related publication: 'Destruction of Weeds by Pulsed High-Voltage Discharges', A. Mizuno, T. Tenma and N. Yamano, Toyohashi University of Technology, 1990.

Example 1: Control of Voltage Generally to Maintain a Constant Voltage Over the Load As the load (i.e. the current drawn) between the applicator unit 8 and earth unit 74 decreases the voltage over the load generally increases. In a similar fashion, as the load between the applicator electrode 26 of the applicator unit 8 and earth unit 74 increases the voltage over the load generally decreases. Accordingly, the voltage of the processed electrical energy 36 can be maintained at particular value or range (i.e. a range defined by a first and/or second predetermined value) by open loop control, or by closed loop control (e.g. by monitoring the voltage of the processed electrical energy 36 using the converter feedback signal 70). The voltage of the processed electrical energy 36 can be increased in response to a decreasing voltage by increasing its duty cycle (or amplitude) or decreased in response to an increasing voltage by decreasing its duty cycle (or amplitude). In this way the voltage is kept as high as possible to optimise the duration (e.g. the speed) of the process.

As an example of this process: the voltage may be maintained at 2 kV or 5 kV or 10 kV, including ±5% or 10% thereof.

Example 2: Control of Current Generally to Maintain a Constant Current Through the Load During treatment of a plant, the current through the plant generally increases due to the resistance of the plant decreasing as damage to the cellular structure occurs. Accordingly, the current of the processed electrical energy 36 can be maintained at particular value or range (i.e. a range defined by a first and/or second predetermined value) by open loop control, or by closed loop control (e.g. by monitoring the current of the processed electrical energy 36 using the converter feedback signal 70). The current of the processed electrical energy 36 can be increased in response to a decreasing current by increasing its duty cycle (or amplitude) or decreased in response to an increasing current by decreasing its duty cycle (or amplitude).

The aforementioned current control may only be applied to a gradually increasing current once it achieves one of the said predetermined values.

In this way overload of the converter can be avoided. Moreover, the voltage is kept as high as possible whilst the current is rising to optimise the duration (e.g. the speed) of the process.

As an example of this process: for a 500 W unit configured to generate processed electrical energy 36 at 5 kV, once the processed electrical energy 36 achieves a current of 0.1 A, the voltage of the processed electrical energy 36 is reduced, to maintain the current of 0.1 A, or 0.1 A±5%.

Example 3: Control of Power to Maintain Generally a Constant Power Through the Load During treatment of a plant, the current through the plant generally increases due to the resistance of the plant decreasing as damage to the cellular structure occurs. Accordingly, the power of the processed electrical energy 36 can be maintained at particular value or range (i.e. a range defined by a first and/or second predetermined value) by open loop control, or by closed loop control (e.g. by monitoring the current and voltage of the processed electrical energy 36 using the converter feedback signal 70). The voltage of the processed electrical energy 36 can be increased in response to a decreasing current by increasing its duty cycle (or amplitude) or decreased in response to an increasing current by decreasing its duty cycle (or amplitude).

The aforementioned power control may only be applied to a gradually increasing power once it achieves one of the said predetermined values.

In this way overload of the converter can be avoided. Moreover, the voltage is kept as high as possible whilst the current is rising to optimise the speed of the process.

As an example of this process: once the processed electrical energy 36 achieves a current of 0.1 A, the voltage of the processed electrical energy 36 is reduced to maintain the power at a first predetermined amount of 500 W or 500 W±5%; as the current continues to increase the voltage is reduced to maintain 500 W or 500 W±5%, e.g. as the current rises to 0.2 A the voltage is reduced to 2.5 kV, and at 0.5 A the voltage is reduced to 1 kV.

Specific Example Circuits for the Electrical Energy Processing Unit

It will be appreciated that the aforementioned circuits of the electrical energy processing unit 6 may comprise various electrical components. Some specific examples of which are provided:

Embodiment 1: Pulse Width Modulated Forward Convertor

Figure 9:
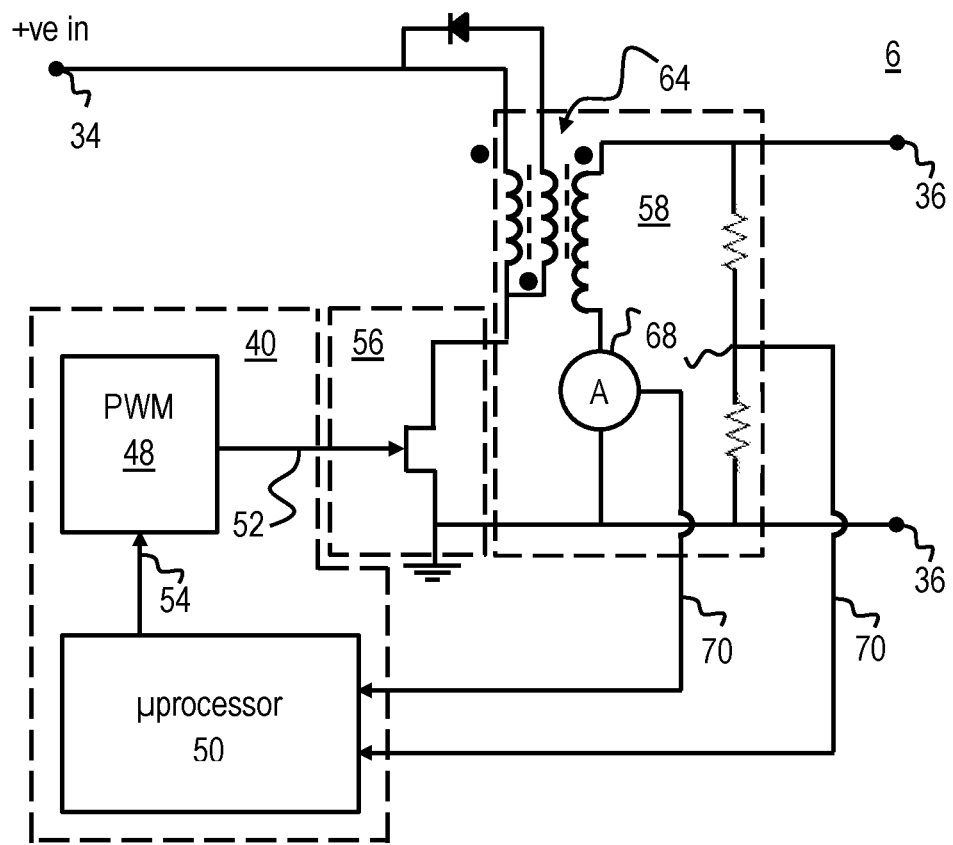
FIG. 9 is a schematic diagram of a first embodiment of the electrical energy processing unit of FIG. 1.

A first embodiment of the electrical energy processing unit 6 is shown in FIG. 9, wherein the control circuit 40 comprises a processor 50 that is a microprocessor and a waveform generation unit 48 that is a pulse width modulator (PWM). The microprocessor controls the PWM by means of control signal 54 that is decoded by the PWM and converted to a square wave. The duty cycle and frequency of the square wave are controlled by the microprocessor via the control signal 54. The control signal 54 may be any suitable signal type, e.g. a digital, DC or AC signal. The PWM outputs the control signal 52 to the converter 38.

The converter 38 comprises a switching unit 56 that is a MOSFET, which is arranged with: the gate connected to the control signal 52 from the PWM; the source grounded; the drain connected to the unprocessed electrical energy 34. The converter 38 further comprises a converter unit 58, which has a transformer 64 with a primary and secondary winding arranged as described in the general example above and a reset winding to rid a core of the transformer of stored energy during the off cycle to avoid/reduce saturation. The converter 38 has sensors 68 consisting of a current sensor in series with the load and a divider arranged over the load for voltage measurement. Accordingly a converter feedback signal 70 from the sensors 68 provides voltage and current information to the processor 50.

The control signal 52 switches the MOSFET 56 to effect switching of the unprocessed electrical energy 34 across the primary winding of the transformer 64, which is transformed at the secondary winding to the processed electrical energy 36.

The first embodiment of the electrical energy processing unit 6 is generally suitable for operation at less than 300 Watts.

Embodiment 2: Linear Amplifier

Figure 10:
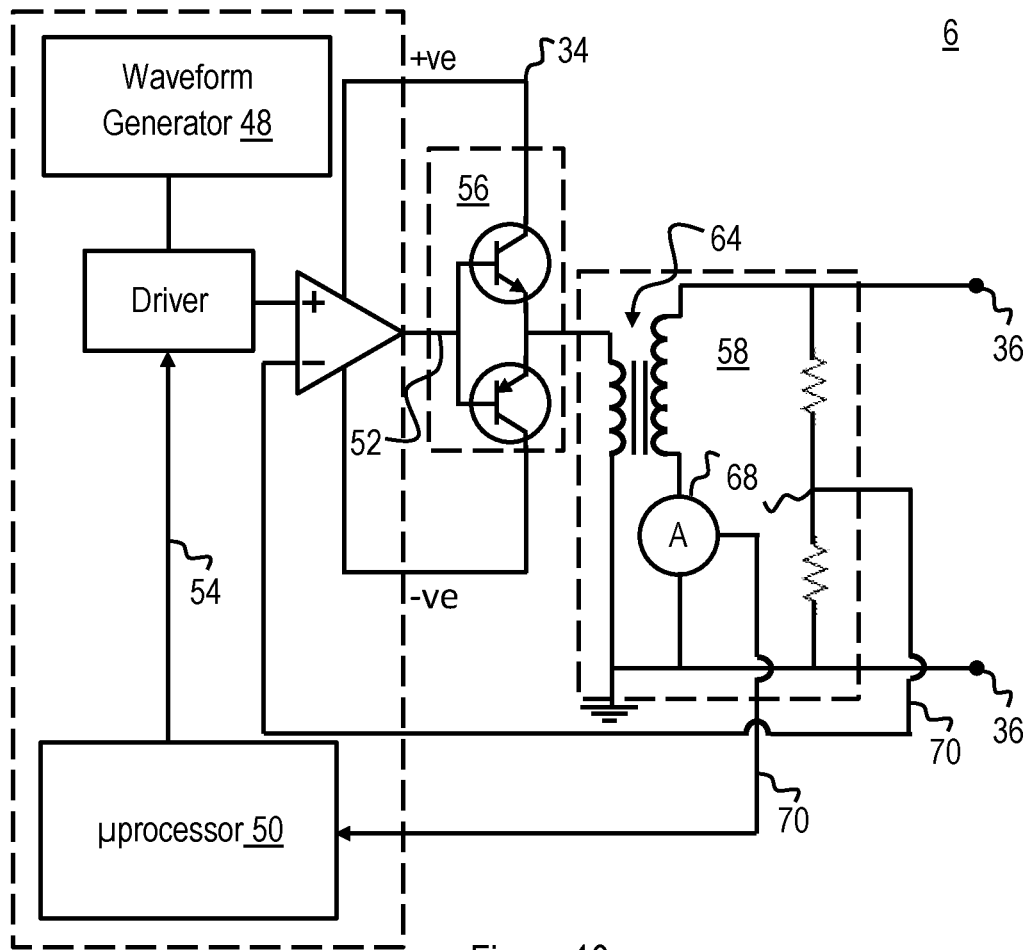
FIG. 10 is a schematic diagram of a second embodiment of the electrical energy processing unit of FIG. 1.

A second embodiment of the electrical energy processing unit 6 is shown in FIG. 10, wherein the control circuit 40 comprises: a processor 50 that is a microprocessor; a waveform generation unit 48; an op-amp and associated driver. The microprocessor 50 controls the driver by means of the control signal 54. The waveform generation unit 48 outputs a control signal to the driver, which may for example be a sine wave (or other one of the aforementioned waves). Aspects of the control signal (e.g. form and frequency) output from the waveform generation unit 48 may be fixed or controllable by the microprocessor 50. The driver transfers the control signal to the non-inverting input of the op-amp where it is amplified to the required level, as will be discussed.

The converter 38 comprises a switching unit 56 that is a NPN transistor and a PNP transistor, which are arranged with: the bases connected in parallel to the control signal 52 from the op-amp; the emitters connected to each other and to the primary winding of the transformer; the collector of the NPN transistor connected to the positive power supply of the op-amp; the collector of the PNP transistor connected to the negative power supply of the op-amp. The converter 38 further comprises a converter unit 58, which has a transformer 64 with a primary and secondary winding arranged as described in the general example above. The converter 38 has sensors 68 consisting of a current sensor in series with the load and a divider arranged over the load for voltage measurement. The current sensor 68 is connected to the microprocessor 50 such that the converter feedback signal 70 provides current and voltage information thereto. The voltage sensor 68 is connected to the inverting input of the op-amp such that the converter feedback signal 70 provides voltage information thereto.

Figure 11A:
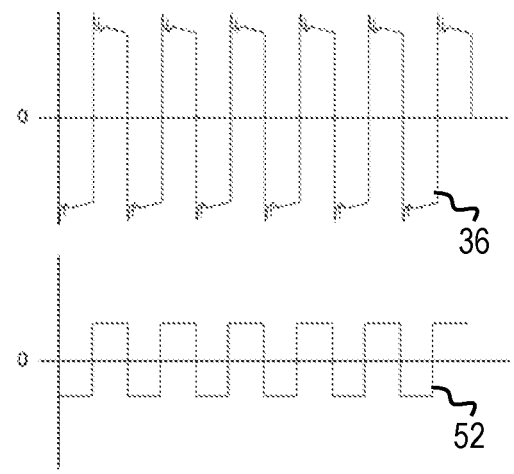
FIGS. 11a and 11b contain illustrations of a waveform signal and a corresponding processed electrical energy output from the second embodiment of the electrical energy processing unit.
Figure 11B:
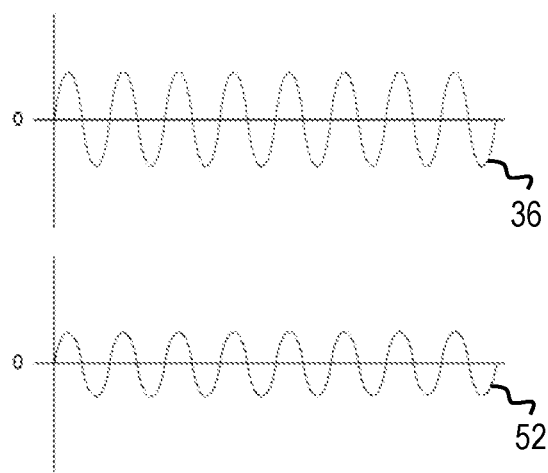

The control signal 52 switches the NPN and PNP transistors when positive or negative respectively to effect switching of the unprocessed electrical energy 34 across the primary winding of the transformer 64 in accordance with the control signal 52. As shown in FIGS. 11a and 11b, the processed electrical energy 36 at the secondary winding of the transformer 64 is substantially an amplification of the control signal 52. More particularly, FIG. 11a shows the amplification of a square control signal 52 and FIG. 11b shows the amplification of a sine control signal 52. The voltage feedback of the converter feedback signal 70 to the inverting input of the op-amp enables the maintaining by the op-amp of a constant voltage as the load (e.g. the resistance of a treated plant) varies. The microprocessor may comprise program code to effect control of the driver to maintain or decrease the gain of the op-amp in accordance with the current feedback of the converter feedback signal 70 to the microprocessor.

The second embodiment of the electrical energy processing unit 6 is generally suitable for operation at less than 1500 Watts.

Embodiment 3: Push-Pull System

Figure 12:
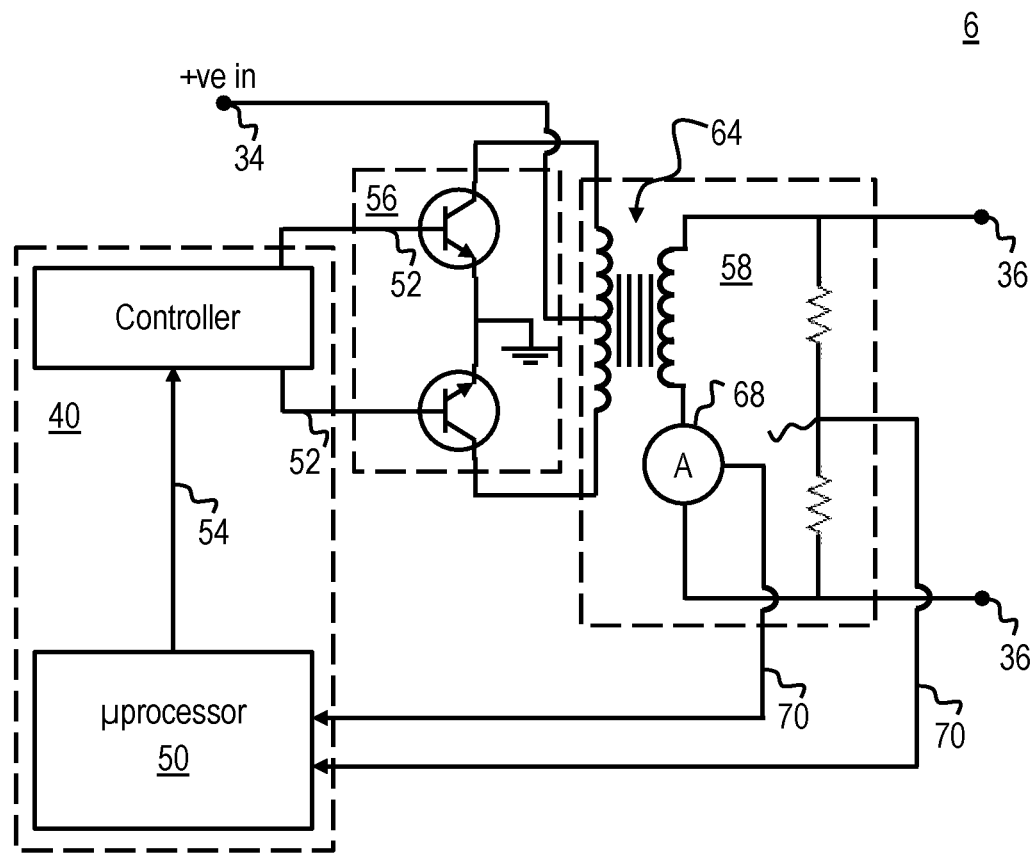
FIG. 12 is a schematic diagram of a third embodiment of the electrical energy processing unit of FIG. 1.

A third embodiment of the electrical energy processing unit 6 is shown in FIG. 12, wherein the control circuit 40 comprises a processor 50 that is a microprocessor and a waveform generation unit 48 that is a controller with an integrated waveform generator. The microprocessor 50 controls the controller by means of the control signal 54 that is decoded by the controller to control the control signal 52. The controller is configured to generate a control signal 52 that comprises a first and second channel that is supplied to the respective first and second transistors of the converter 38. The first and second channel waveforms are both square waves, the duty cycle and frequency of which is controlled by the microprocessor via the control signal 54. The control signal 54 may be any suitable signal type, e.g. a digital, DC or AC signal.

The converter 38 comprises a switching unit 56 that comprises a first and second NPN transistor, which are arranged with: the base of the first transistor connected to the first channel control signal 52 from the controller; the base of the second transistor connected to the second channel control signal 52 from the controller; the emitters grounded; the collector of the first transistor connected to first primary windings of the transformer 64; the collector of the second transistor connected to second primary windings of the transformer 64.

The converter further comprises a converter unit 58, which comprises the transformer 64 with a secondary winding arranged as described in the general example above. The unprocessed electrical energy 34 is connected to both primary windings of the transformer. The primary windings are arranged such that their energising causes flux to flow in the core in respective first and second opposed directions. Accordingly, the transistors are sequentially switched by the first and second channel control signals to effect the transformation of processed electrical energy 36 that corresponds to the sum of the first channel control signal with the out of phase second channel control signal.

The converter 38 has sensors 68 consisting of a current sensor arranged in series with the load and a divider arranged over the load for voltage measurement. Accordingly a converter feedback signal 70 from the sensors 68 provides voltage and current information to the processor 50.

The third embodiment of the electrical energy processing unit 6 is generally suitable for operation at less than 1000 Watts.

Embodiment 4: Full Bridge Converter

Figure 13:
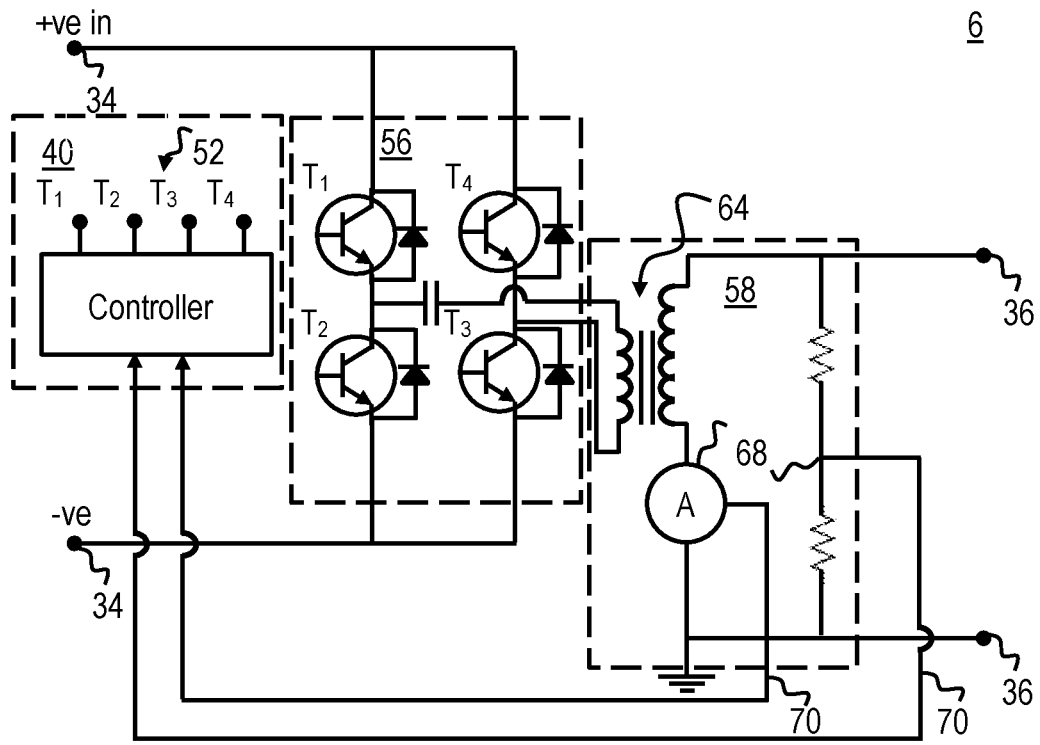
FIG. 13 is a schematic diagram of a fourth embodiment of the electrical energy processing unit of FIG. 1.

A fourth embodiment of the electrical energy processing unit 6 is shown in FIG. 13, wherein the control circuit 40 comprises a processor and waveform generator integrated as a controller. The controller is configured to generate a control signal that comprises a first, second, third and fourth channel that is supplied to the respective first, second, third and fourth transistors of the converter. The first, second, third and fourth channel waveforms are all square waves, the duty cycle and frequency of which is controlled by the controller.

The converter comprises a switching unit 56 that comprises the first T1, second T2, third T3 and fourth T4 NPN transistors. The transistors are arranged to in series pairs: T1 and T2; T3 and T4. The converter further comprises a converter unit 58, which comprises a transformer 64 with a secondary winding arranged as described in the general example above. The primary winding of the transformer is connected across the junctions of the series pairs. The controller supplies the control signal that sequentially switches opposed transistor pairs: T1 and T3; T2 and T4. The current therefore travels via the said opposed pairs to effect an alternating current across the primary winding. Accordingly, the processed electrical energy 36 transformed corresponds to the sum of the first (and third) channel control signal with the out of phase second (and fourth) channel control signal.

The converter 38 has sensors 68 consisting of a current sensor arranged in series with the load and a divider arranged over the load for voltage measurement. Accordingly a converter feedback signal 70 from the sensors 68 provides voltage and current information to the controller.

The fourth embodiment of the electrical energy processing unit 6 is generally suitable for operation at above 1000 Watts.

General Example of Apparatus for Agriculture

FIG. 14 shows and overall example of the apparatus 2 when adapted for agriculture, wherein: the electrical energy source 4 comprises a vehicle according to the second embodiment; the electrical energy processing unit 6 is arranged on a towed vehicle; a plurality of applicator units 8 extend from the vehicle; the earth unit 74 comprises a rotary member according to the second embodiment.

Electrical Continuity System.

Figure 15:
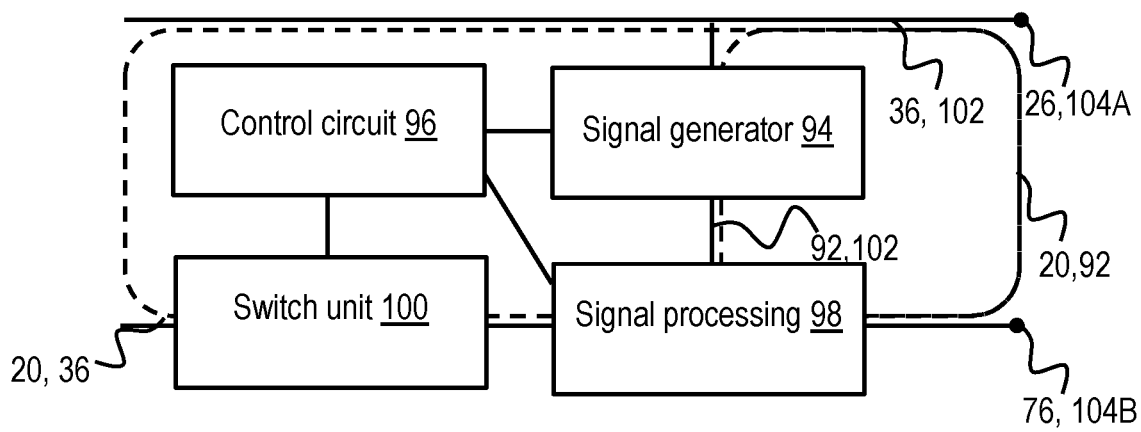
FIG. 15 is a block diagram of an embodiment of an electrical continuity system of the electrical weed killing apparatus of FIG. 1.

The electrical continuity system 90, as illustrated in the block diagram of FIG. 15, is operable to: determine the electrical continuity between the ground and one or both of the earth electrode 76 and applicator electrode 26; control, using the determined electrical continuity, the processed electrical energy 36 transmitted between the said electrodes. The electrical continuity system 90 comprises at a second level of the apparatus 2 a: electrical continuity circuit 92; continuity signal generator 94; control circuit 96; a continuity signal processing arrangement 98; optionally a switch unit 100, which are described sequentially.

The afore-described electrical energy processing unit 6 is a particular (but non-limiting) example, wherein the processed electrical energy 36 is non-steady and has a high frequency, i.e. above 18 kHz. The electrical continuity system 90 may be applied to this configuration of electrical energy processing unit 6, or to one that is configured produce other frequencies of processed electrical energy 36, i.e. any frequency and voltage to kill a plant or at least attenuate plant growth a plant, e.g. 50 Hz and above, such as 50-60 Hz at 14 kV as disclosed in the aforementioned apparatus in U.S. Pat. No. 4,338,743. It will be appreciated that the described electrical energy processing unit 6 could produce processed electrical energy 36 of this kind, e.g. via control of the processor 50 or otherwise.

Moreover, the electrical continuity system 90 may be applied to an electrical energy processing unit that is operable to generate a steady DC processed electrical energy to electrically kill a plant or at least attenuate plant growth, e.g. it comprises 1 kV to 30 kV and a current of at least 10 mA. Such an electrical energy processing unit 6 may comprise a DC to DC converter, such as a switch mode converter or other suitable power converter.

Electrical Continuity Circuit

Figure 16:
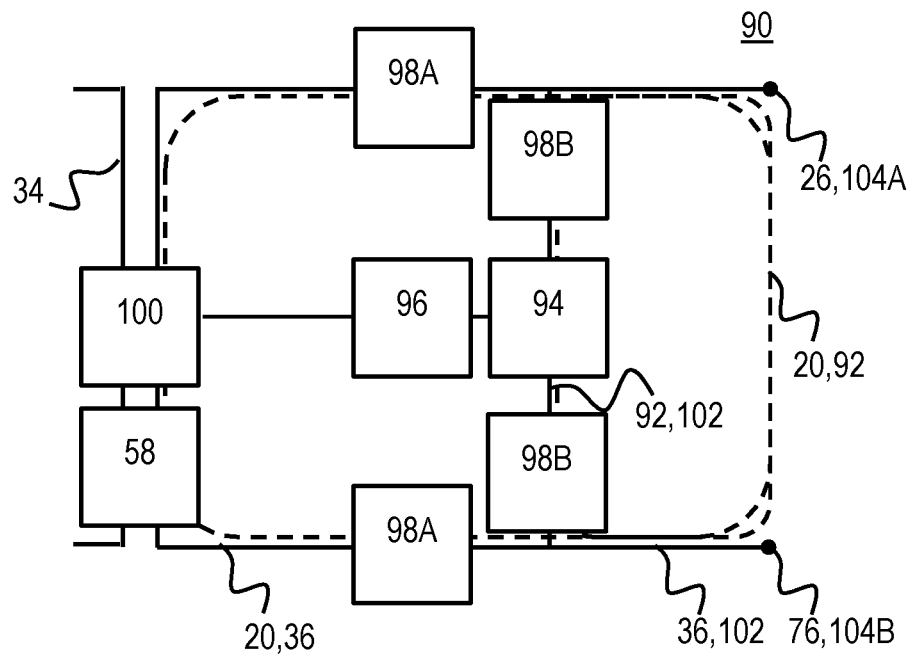
FIG. 16 is a system level diagram of an embodiment of an electrical continuity system of the electrical weed killing apparatus of FIG. 1.

The electrical continuity circuit 92 is for transmission of an electrical continuity signal 102, which is generated from the signal generator 94, around a circuit including the ground and including, or in operational proximity to, one or both of the applicator electrode 26 and the earth electrode 76. The continuity circuit 92 comprises a first continuity electrode 104A and a second continuity electrode 104B, which are electrically connected as part of the said circuit. The continuity electrodes 104 can be integrated with (i.e. electrically common to) the earth electrode 76 and applicator electrode 26. Alternatively one or both of the continuity electrodes 104 are separate from (i.e. not electrically common to) and arranged in operational proximity to, one or both of the earth electrode 76 and applicator electrode 26. Various examples of the aforesaid arrangements are described:

In a first embodiment of the electrical continuity system 90, an example of which is illustrated in FIG. 16: the first continuity electrode 104A is integrated with the applicator electrode 26; the second continuity electrode 104B is integrated with the earth electrode 76. Accordingly, electrical continuity is determined along a path of the processed electrical energy 36 when transmitted through the ground between the earth and applicator electrodes.

Figure 17:
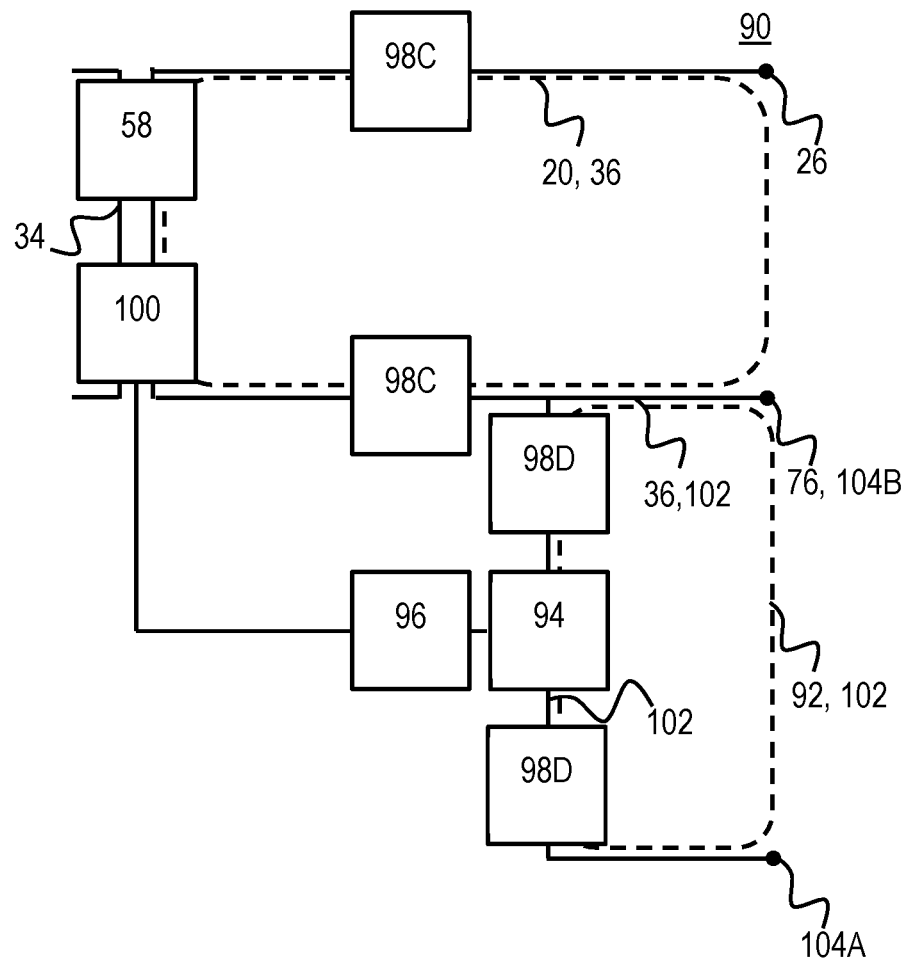
FIG. 17 is a system level diagram of an embodiment of an electrical continuity system of the electrical weed killing apparatus of FIG. 1.

In a second embodiment of the electrical continuity system 90, an example of which is illustrated in FIG. 17: the second continuity electrode 104B is integrated with the earth electrode 76; the first continuity electrode 104A is separate from and arranged in operational proximity to the applicator electrode 26 (to enable determination of the electrical continuity along a path similar to the processed electrical energy when transmitted through the ground between the earth and applicator electrodes) or earth electrode 76 (to enable determination of the electrical continuity along a path similar to the processed electrical energy when transmitted through the ground and earth electrode).

In a third embodiment of the electrical continuity system 90 (not shown): the first continuity electrode 104A is integrated with the applicator electrode 26; the second continuity electrode 104B is separate from and arranged in operational proximity to the applicator electrode 26 (to enable determination of the electrical continuity along a path similar to the processed electrical energy when transmitted through the ground and applicator electrode) or earth electrode 76 (to enable determination of the electrical continuity along a path similar to the processed electrical energy when transmitted through the ground between the earth and applicator electrodes).

In a fourth embodiment of the electrical continuity system 90 (not shown): the first continuity electrode 104A is separate from and arranged in operational proximity to the applicator electrode 26 or earth electrode 76; the second continuity electrode 104B is separate from and arranged in operational proximity to the applicator electrode 26 or earth electrode 76. For example: both of the continuity electrodes 104A, B are arranged in operational proximity to the earth electrode 76 or applicator electrode 26 (to enable determination of the electrical continuity between the ground and the said earth or applicator electrode); one of the continuity electrodes 104 is arranged in operational proximity to the earth electrode 76 and the other continuity electrode 104 is arranged in operational proximity to the applicator electrode 26 (to enable determination of the electrical continuity along a path similar to that of the processed electrical energy when transmitted through the ground between the earth and applicator electrodes).

Generally the first, second and third embodiment electrical continuity systems 90 are desired (although not by way of limitation of the scope of present disclosure), particularly as the integration of the electrodes is both economical and increases the accuracy of the determined electrical continuity. It will also be appreciated that the aforesaid embodiment arrangements may be combined, or applied as a plurality (e.g. for the second-fourth embodiments there are multiple continuity electrodes 104 for enhanced accuracy). The first and second embodiments are exemplified following, although it will be appreciated that the teaching can be applied to the other embodiments, where applicable.

In embodiments wherein a continuity electrode 104 is separate from and is in operational proximity the earth electrode 76 or applicator electrode 26, the said continuity electrode 104 may comprise a similar configuration to the associated electrode, which is discussed above e.g. a configuration similar to the first or second embodiment earth electrode 76 and may be connected to the same or a separate insulating body, or other suitable arrangement.

Herein operational proximity can be defined as any suitable distance to enable a representative measurement of the electrical continuity at the earth or applicator electrode, e.g. for the second or third embodiment operational proximity may be 2 cm-2 m or 1 cm-50 cm along or through the ground from the relevant applicator or earth electrode. Notably the exact distance will depend on the properties of the continuity signal 102, together with other operational parameters, such as soil moisture content, electrode configuration etc.

Signal Generator

The signal generator 94 is operable to generate a continuity signal 102, which may be processed to determine the electrical continuity between the combinations of the aforesaid electrodes 104 depending on their embodiment arrangement. The signal generator 94 may be configured to generate various continuity signals 102, e.g. DC (including non-steady and steady DC) or AC signals.

To generate a steady signal the signal generator 94 may comprise DC to DC converter such as a switch mode converter or other suitable power converter. The said converter may be controlled by a processor of the control circuit 96, which is, in certain non-limiting embodiments, the processor 50. The steady continuity signal 102 generally has a voltage in the range of 1 V to 100 V or more, such as (but not limited to) about 10 V to 100 V. The current of the steady continuity signal 102 can be 0.1 mA-100 mA.

With a non-steady signal, (i.e. AC or DC) the signal generator 94 generates a specific form of the continuity signal 102, which may have a waveform that repeats at a particular frequency. The shape of a repeating unit of the waveform may comprise a periodic or aperiodic waveform, i.e. a waveform that continuously repeats with the repeating units therein having a constant or a varying period, e.g. a pulsed wave with a fixed duty cycle or a varying duty cycle. The shape of the repeating unit may be one of or a combination of one or more of the following forms: sine wave; saw-tooth wave; triangular wave; square wave; pulsed; other known form. The exact shape of the repeating unit may be an approximation of one of the aforesaid forms for reasons of distortion, e.g. overshoot/undershoot and the associated ringing and settle time. The repeating unit may be positive or negative or a combination thereof with respect to a reference value, which is typically 0 V. To generate the non-steady signal, (i.e. AC or DC) the signal generator 94 may comprise a converter and one or both of a waveform generator unit and processor: such an arrangement was described above for achieving the desired form of the processed electrical energy 36, and hence for brevity is not further described.

The non-steady continuity signal 102 can have various properties: the peak voltage can be 1 Vrms-100 Vrms or more, such as (but not limited to) about 10 Vrms-100 Vrms; the current can be 0.1 mA rms-100 mA rms (in the example wherein the signal generator 94 comprises a constant current source the maximum current will be determined by the associated electrical energy source, i.e. the compliance voltage); the frequency can be 20 Hz-200 kHz.

Generally, the frequency and/or waveform of the continuity signal 102 are substantially different to that of the processed electrical energy 36 to enable it to be isolated and processed. It may be desirable (although not by way of limitation of the present disclosure) for reasons of complexity of signal processing componentry to have a distinct frequency difference in this respect, e.g.: the frequency of the continuity signal 102 is at least 150% or 200% or several octaves or decades greater or lower. For example: for a processed electrical energy 36 of 50 Hz, the continuity signal 102 can be 500 Hz or 5 kHz i.e. one or two decades higher respectively; for a processed electrical energy 36 of 25 kHz, the continuity signal 102 can be 250 Hz i.e. two decades lower. An advantage of a lower frequency continuity signal 102 is less potential interference from harmonics associated with the waveform of the processed electrical energy 36. Alternatively, the frequency of the continuity signal 102 and processed electrical energy 36 can be the same or similar, but with different shaped waveforms, e.g. two different waveforms selected from a list comprising: sine wave; saw-tooth wave; triangular wave; square wave; pulsed; a combination of one or more of the aforesaid waveforms.

For the aforesaid continuity signals, the signal generator 94 may be configured to encode information therein. The encoded information may be processed to decode the information and the decoded information authenticated as part of the continuity determining process.

The continuity signal 102 may encode the information as a series of pulses, e.g.: an AC or DC non-steady signal comprises a repetition of one or more waveforms followed by a baseline value, each for a predetermined time, whereby the baseline value encodes a 1 and the waveforms encode a 0 (or the converse) of a bit, with a succession of the said repetitions encoding one or more bytes; a steady signal comprises one or more pulses with a pulse encoding a 1 and the absence thereof encoding a 0 (or the converse) of a bit, with a succession of the said pulses encoding one or more bytes. The continuity signal 102 may alternatively encode information by the form of the waveform, such as square or saw tooth or by the period of the waveform or another characteristic thereof, e.g.: a long period encodes a 1 and a shorter period encodes a 0, with a succession of the said periods encoding one or more bytes; a square wave encodes a 1 and a saw tooth wave encodes a 0, with a succession of the said waveforms encoding one or more bytes. In the aforesaid examples the encoding may be achieved by a chopper that is: controlled by the signal generator 94 or processor 50; arranged in series with the electrical continuity circuit 92, or other suitable example, e.g. pulse width modulation. Moreover the said bytes can be stored on a memory unit, e.g. the memory unit of the processor 50 or that of another processor, for authentication as will be discussed.

Continuity Signal Processing Arrangement

The signal processing arrangement 98 configured to at least partially isolate the continuity signal 102 from the processed electrical energy 36, such that the processed electrical energy 36 does not substantially interfere with the control circuit 96 determining the said electrical continuity. The signal processing arrangement 98 may isolate the continuity signal 102 from the processed electrical energy 36 using one of more of the attributes: frequency difference; a difference in the shape of the waveform, e.g. amplitude or period or form; other property thereof.

The signal processing arrangement 98 comprises one or more filters for the said isolation. The filters may comprise: low-pass; high-pass; band-pass; band-stop, or other suitable filter types. The specific type of filter can be achieved by a: capacitor; inductor; or combinations thereof, which are arranged in a series or parallel configuration. The specific configuration of such filters is known in the art and therefore is not described in detail herein. The filters can comprise the aforesaid passive components or may be actively adjustable such that the filter frequency, e.g. pass or stop frequency, is adjustable. In an example of the latter the filter frequency can be adjusted by the processor 50 such that the aforesaid signal isolation is maintained as a frequency of the processed electrical energy 36 and/or continuity signal 102 is changed.

The specific type and arrangement of the filter is selected to correspond to the configuration of the processed electrical energy 36 and electrical continuity system 90, e.g. the specific configuration of the continuity signal 102 and continuity electrode 104 arrangements. Two possible embodiment circuit configurations are illustrated in FIGS. 16 and 17.

Initially the embodiments, which are illustrated in FIGS. 16 and 17, are described with the condition of the processed electrical energy 36 being non-steady (i.e. DC or AC) with a particular frequency and the continuity signal 102 being either: a steady DC signal; or non-steady (i.e. DC or AC) and with a frequency less than that of the processed electrical energy 36 (e.g. the processed electrical energy 36 comprises a waveform with a frequency of 20 kHz and the continuity signal 102 comprises a waveform with frequency of 1 kHz).

In the first embodiment electrical continuity system 90, which is illustrated in FIG. 16, the signal processing arrangement 98 comprises filters 98A and 98B. One or more filters 98A are arranged to isolate a circuit comprising the converter unit 58 (e.g. the secondary winding of the transformer 64) from the continuity signal 102 and thus comprise high-pass filters. In the example two filters 98A are shown on either side of the converter unit 58, however a single filter 98A may alternatively be used. One or more filters 98B are arranged to isolate the signal generator 94 and/or control circuit 96 from the processed electrical energy 36 and thus comprise low-pass filters. In the example two filters 98B are shown on either side of the said unit, however a single filter 98B may alternatively be used.

In the second embodiment electrical continuity system 90, which is illustrated in FIG. 17, the signal processing arrangement 98 comprises filters 98C and 98D. One or more filters 98C are arranged to isolate a circuit comprising the converter unit 58 (e.g. the secondary winding of the transformer 64) from the continuity signal 102 and thus comprise high-pass filters. In the example two filters 98C are shown on either side of the converter unit 58, however a single filter 98C may alternatively be used. One or more filters 98D are arranged to isolate the signal generator 94 and/or control circuit 96 from the processed electrical energy 36 and thus comprise low-pass filters. In the example two filters 98D are shown on either side of the said unit, however a single filter 98D may alternatively be used.

The embodiments, which are illustrated in FIGS. 16 and 17, will now be described with the condition of the continuity signal 102 being non-steady (i.e. DC or AC) with a particular frequency and with the processed electrical energy 36 being either: a steady DC signal; or non-steady (i.e. DC or AC) and with a frequency less than that of the continuity signal 102 (e.g. the processed electrical energy 36 comprises a waveform with frequency of 50 Hz and the continuity signal 102 comprises a waveform with frequency of 10 kHz). In the first embodiment electrical continuity system 90, which is illustrated in FIG. 16, the: filters 98A are low-pass; filters 98B are high-pass. In the second embodiment electrical continuity system 90, which is illustrated in FIG. 17, the: filters 98C are low-pass; filters 98D are high-pass.

It will be appreciated that the above first and second embodiment electrical continuity systems 90 may alternatively comprise band-pass and stop filters, e.g.: in the first embodiment filters 98A are band stop with respect to a band encompassing the continuity signal 102, filters 98B are band pass with respect to a band encompassing the continuity signal 102; in the second embodiment filters 98C are band stop with respect to a band encompassing the continuity signal 102, filters 98D are band pass with respect to a band encompassing the continuity signal 102.

In embodiments wherein the continuity signal 102 and processed electrical energy 36 are both non-steady with the same or a similar frequency and each comprise different waveforms, the signal processing arrangement 98 can be configured to separate the said waveforms based on their shape, or process attributes thereof. For example, the processed electrical energy 36 comprises a sine waveform and the continuity signal 102 comprises a square waveform: the first embodiment, which is illustrated in FIG. 16, comprises low-pass filters 98A to allow passing of the sine waveform and fundamental frequency of the square wave and high-pass filters 98B to allow passing of one of the odd harmonics associated with the square wave, e.g. the first, third or fifth harmonic; the second embodiment, which is illustrated in FIG. 17, comprises low-pass filters 98C to allow passing of the sine waveform and fundamental frequency of the square wave and high-pass filters 98D to allow passing of one of the odd harmonics associated with the square wave, e.g. the first, third or fifth harmonic. The electrical continuity can therefore be determined by the processing of the said harmonic.

It will be appreciated that the third embodiment electrical continuity system 90 may be achieved with a signal processing arrangement 98 of a similar configuration to that of the second embodiment. The fourth embodiment electrical continuity system 90, may be achieved with a signal processing arrangement 98 having: one or more first filter arranged to isolate the signal generator 94 and/or control circuit 96 from the processed electrical energy 36; one or more second filters arranged to isolate a circuit comprising the converter unit 58 from the continuity signal 102.

Control Circuit of Continuity System

The control circuit 96 of the continuity system 90 is operable to: determine the electrical continuity; control the processed electrical energy 36 using said determined electrical continuity, these steps are described sequentially.

To determine the electrical continuity the control circuit 96 is typically operable to: measure, using said isolated continuity signal 102 or a property related thereto, the electrical continuity; compare the measured continuity to a predetermined condition, which is typically a reference value for the measured continuity, these steps are described sequentially.

As examples of the measurement using the continuity signal 102, the measured property may comprise: measuring the drop in electrical potential of the continuity signal 102 between the continuity electrodes 104A/104B (wherein the later discussed reference value is a particular electrical potential); the electrical current of the continuity signal 102 through the electrical continuity circuit 92 to maintain a drop of a particular electrical potential over the continuity electrodes 104A/104B (wherein the later discussed reference value is a particular electrical current). Other properties of the continuity signal 102 may be measured, such as the phase of the current with respect to voltage.

As an example of the measurement of a property related to the continuity signal 102, the electrical potential may be measured over a signal generator 94 that comprises a constant current source and is operable to provide a constant current continuity signal 102 through the electrical continuity circuit 92 (wherein the later discussed reference value is a particular electrical potential). In this example in response to low electrical continuity in the electrical continuity circuit 92 the electrical potential over the constant current source automatically increases to maintain the said constant current; in response to high electrical continuity in the electrical continuity circuit 92 the electrical potential over the constant current source automatically decreases to maintain the said constant current.

It will be appreciated that the above examples of measuring using the continuity signal 102 or a property relate thereto can comprise directly measuring the said parameter or that of a representative signal derived therefrom (e.g. the voltage is suitably reduced by means of a divider to a pin of the processor).

The comparing aspect of the control circuit 96 comprises the comparison of the said measured electrical continuity to a predetermined condition, i.e. a particular reference value for the continuity. Such a comparison can be achieved by a comparator, which may be arranged discrete from or integrated in a processor, such as (but not limited to) the processor 50. A high electrical continuity can be determined if the determined continuity is greater than (including equal to) the reference value. A low electrical continuity can be determined if the determined continuity is less than the reference value (or the converse). The aforesaid reference value is determined experimentally since it will be appreciated that it depends on various conditions, e.g. the: processed electrical energy 36; continuity signal 102; ground conditions, such as soil type and moisture; type of plants to be treated.

The electrical continuity may be determined periodically or continuously, for example: in an example of an analogue circuit (e.g. the comparison is performed using a comparator comprising an analogue integrated circuit) the determination may be continuously; in an example of a digital circuit (e.g. the comparison is performed using a processor comprising a microcontroller) the continuity may be determined with a sampling frequency, e.g. 20-50 Hz.

To determine the electrical continuity in the example wherein the continuity signal encodes information, the control circuit 96 is operable to: process the encoded information to decode the information; authenticate the decoded information with stored information, both steps are described sequentially.

The step of processing the encoded information to decode the information typically comprises using a processor (which may be the processor 50 or a separate processor) to: receive the continuity signal 102 following transmission around the electrical continuity circuit 92 (or a representative signal derived therefrom, e.g. the voltage is suitably reduced by means of a divider to a pin of the processor); optionally convert the signal to digital data; optionally apply a regression routine or other suitable data processing technique to remove any noise therefrom; process the said data/received signal to decode the information, which may comprise the application of a regression routine or other suitable data processing technique, which is implemented on the said processor.

The step of authenticating the decoded information may comprise comparing the decoded information to information that is stored as digital data on a memory unit of or associated with the processor. If the information is authenticated (e.g. the stored information is sufficiently similar to that of the decoded information) then a condition of electrical continuity can be determined, else a condition of electrical continuity is not determined.

The information may be decoded and authenticated in this manner on start-up and/or periodically, e.g. with a sampling frequency of 10-50 Hz. An advantage of such a means for determining continuity is that the electrical continuity system 90 can be made significantly less susceptible to interference from other electrical signals that may occur particularly in noisy environments, e.g. a signal from another electrical system that is similar to or can interfere with the measurement of the continuity signal 102.

The aforementioned means for determination of the electrical continuity can be combined or used independently. It is particularly advantageous to use the decoded and authenticate means at start-up and periodically thereafter when combined with one of the other less computationally intensive means (e.g. the method comprising measuring the drop in electrical potential drop between the electrodes or the method comprising measuring the electrical potential over a constant current source that generates the continuity signal) at a higher sampling frequency.

The control aspect of the control circuit 96 comprises the control the said processed electrical energy 36 generally by: preventing its transmission if low continuity is determined; enabling its transmission if high continuity is determined. However the said control may alternatively comprise dimming the processed electrical energy 36, e.g. to a power of 50 or 75% in the event of low continuity. Generally control is by means of controlling an electrically operated switch of the switch unit 100. However in examples wherein the control circuit 96 comprises the processor 50, the said control can be by means of control of the control signal 52 or otherwise.

Switch Unit

The processed electrical energy switch unit 100 is operable to: receive the switching signal from the control circuit 96; effect switching on or off of the processed electrical energy 36. The switch unit 100 comprises an electrically operated switch for the said switching, the configuration can for example comprise: the electrically operated switch of the switching unit 56 and/or an additional electrically operated switch to switch the unprocessed electrical energy 34 through the converter 38; a circuit breaker, such as a medium-high voltage circuit breaker operated by a protective relay, to switch directly the processed electrical energy 36; an electrically operated switch of the electrical energy source 4, which can be controlled via the electrical energy source feedback and control signal 78 via the processor 50.

LIST OF REFERENCES

2 Apparatus to control plant growth
4 Electrical energy source
34 Unprocessed electrical energy
Embodiment 1
10 Internal combustion engine
12 Electro-magnetic generator
14 Controls
Embodiment 2
16 Vehicle
18 Electro-magnetic generator
6 Electrical energy processing unit
36 Processed electrical energy
38 Converter
56 Switching unit
58 Converter unit
64 Transformer
68 Sensor
70 Converter feedback signal
40 Control circuit
48 Waveform generation unit
52 Control signal
50 Processor
78 Electrical energy source feedback and control signal
54 Control signal
42 User interface
44 User interface signal
20 Processed electrical energy circuit
74 Earth unit
76 Earth electrode
8 Applicator unit
Embodiment 1
22 Head
26 Applicator electrode
24 Body
80 Mounting/holding portion
28 Extension portion
Embodiment 2
82 Frame (applicator electrode 26)
84 Central portion
86 Side portion
88 Vehicle
90 Electrical continuity system
92 Electrical continuity circuit
104 Continuity electrode
94 Signal generator
102 Continuity signal
96 Control circuit
98 Continuity signal processing arrangement
100 Switch unit

What is claimed is:

1. A method of electrically killing a plant or at least attenuating plant growth using an apparatus, wherein the plant comprises a stem that extends above the ground, the method comprising:
   directly transmitting processed electrical energy having an electrical current between an applicator electrode of an applicator unit of the apparatus and an earth electrode of an earth unit of the apparatus and through a portion of the plant that extends above the ground to form a circuit that includes the portion of the plant that extends above the ground, wherein the applicator electrode directly transmits the processed electrical energy to at least part of the plant that extends above the ground such that the electrical current travels through the at least part of the plant above ground as part of a circuit and the electrical current returns to the earth electrode through the ground;
   transmitting a continuity signal to or in operational proximity to one or both of the electrode(s), wherein the continuity signal is different from the processed electrical energy and includes at least one property;
   isolating, using a signal processing arrangement, at least part of the continuity signal from the processed electrical energy;
   determining, using the isolated part of the continuity signal or the at least one property related thereto, an electrical continuity between the ground and one or both of the electrodes; and
   controlling, using said determined electrical continuity, transmission of the processed electrical energy.

2. The method of claim 1, further comprising:
   encoding information with the continuity signal; and
   determining said electrical continuity by decoding and authenticating the encoded information.

3. The method of claim 1, wherein the apparatus comprises:
   an electrical energy processing unit to transmit the processed electrical energy between the applicator electrode of the applicator unit and the earth electrode of the earth unit, wherein the applicator unit and the earth unit are arranged for direct transmission of the processed electrical energy through the circuit comprising at least a portion of the plant that extends above the ground; and
   an electrical continuity system comprising:
      a signal generator that generates the continuity signal and transmits said signal around a continuity circuit including, or in operational proximity to, one or both of the electrode(s);
      the signal processing arrangement that at least partially isolates the transmitted continuity signal from the electrical energy; and
      a control circuit that is operable to perform the determining and controlling steps of the method.

4. The method of claim 3, wherein the electrical energy processing unit of the apparatus comprises:
   a converter configured to receive unprocessed electrical energy from an electrical energy source, to convert the unprocessed electrical energy to the processed electrical energy having an electrical current and to transmit the processed electrical energy between the applicator electrode and the earth electrode; and
   a control circuit operable to control the converter to convert the unprocessed electrical energy to the processed electrical energy.

5. The method of claim 3, wherein the continuity circuit of the apparatus comprises first and second continuity electrodes with the continuity signal transmitted therebetween.

6. The method of claim 5, wherein the first and second continuity electrodes have an arrangement selected from one of the following:
   the first continuity electrode is incorporated with the applicator electrode and the second continuity electrode is incorporated with the earth electrode;
   the first continuity electrode is incorporated with the applicator electrode and the second continuity electrode is arranged in operational proximity to, without being incorporated with, one of the applicator electrode or earth electrode;
   the second continuity electrode is incorporated with the earth electrode and the first continuity electrode is arranged in operational proximity to, without being incorporated with, one of the applicator electrode or earth electrode; and
   the first continuity electrode is arranged in operational proximity to, without being incorporated with, one of the applicator electrode or earth electrode and the second continuity electrode is arranged in operational proximity to, without being incorporated with, one of the applicator electrode or earth electrode.

7. The method of claim 3, wherein the electrical energy processing unit and the electrical continuity system of the apparatus are configured to generate respective processed electrical energy and continuity signals that can be at least partially filtered from each other by one or more filters of the signal processing arrangement, the filters selected from the group comprising: high-pass; low-pass; band-pass; and band stop.

8. The method of claim 3, wherein the electrical energy processing unit of the apparatus is configured to generate the processed electrical energy:
   that is non-steady and comprises a waveform with a frequency; or
   that is steady.

9. The method of claim 8, wherein the continuity signal comprises a frequency that is different to the frequency of the processed electrical energy or the continuity signal is steady, to enable it to be at least partially filtered from the processed electrical energy by the signal processing arrangement.

10. The method of claim 9, wherein the difference in frequency is at least 50% or an octave or decade greater or lower.

11. The method of claim 3, wherein the signal generator is configured to generate the continuity signal:
   that is non-steady and comprises a waveform with a frequency; or
   that is steady.

12. The method of claim 3, wherein the control circuit of the apparatus is operable to:
   compare the determined electrical continuity to a predetermined condition;
   enable transmission of the processed electrical energy between the applicator electrode and the earth electrode if the predetermined condition is satisfied; and/or
   prevent transmission of the processed electrical energy between the applicator electrode and earth electrode if the predetermined condition is not satisfied.

13. The method of claim 3, wherein said determining of the electrical continuity using the isolated continuity signal comprises the control circuit configured to measure an aspect of the transmitted continuity signal, wherein the aspect is selected from the group consisting of voltage; phase; current; power; and shape of waveform.

14. The method of claim 3, wherein said determining of the electrical continuity using a property related to the continuity signal comprises the control circuit configured to measure an electrical potential to maintain the continuity signal with a constant current through the electrical continuity circuit.

15. The method of claim 3, wherein said determining of the electrical continuity using the continuity signal comprises the: signal generator configured to generate the continuity signal that encodes information; the control circuit operable to determine electrical continuity by, for the transmitted continuity signal, decoding and authenticating said information.

16. The method of claim 3, wherein the signal processing arrangement of the apparatus is configured to prevent the processed electrical energy from interfering with the determination of the electrical continuity.

17. The method of claim 16, wherein the signal processing arrangement comprises one or more first filters arranged in series with the signal generator of the electrical continuity system, the first filters being configured to allow passing of at least part of the continuity signal and to prevent the passing of at least part of the processed electrical energy.

18. The method of claim 3, wherein the signal processing arrangement of the apparatus is configured to prevent at least part of the continuity signal being transmitted around a circuit other than the continuity circuit.

19. The method of claim 18, wherein the signal processing arrangement comprises one or more second filters arranged in series with a converter unit of the converter, the second filters being configured to prevent the passing of at least part of the continuity signal.

20. The method of claim 1, wherein in the directly transmitting step, the processed electrical energy comprises a waveform with a frequency of at least 18 kHz and with a peak voltage of at least 1 kV and with an electrical current of at least 10 mA rms.

21. A method of electrically killing a plant or at least attenuating plant growth using an apparatus, wherein the plant comprises a stem that extends above the ground, the method comprising:

obtaining an apparatus comprising an electrical energy processing unit, an applicator unit comprising an applicator electrode, an earth unit comprising an earth electrode, and an electrical continuity system, wherein the electrical energy processing unit comprises a converter operable to receive unprocessed electrical energy from an electrical energy source, to convert the unprocessed electrical energy to processed electrical energy having an electrical current, and to transmit the processed electrical energy between the applicator electrode and the earth electrode, wherein each of the applicator unit and the earth unit comprises an electrically conductive material and is electrically coupled to the converter, wherein the applicator unit is operable to receive the processed electrical energy and to apply the processed electrical energy directly to at least a portion of a plant that extends above the ground, and wherein the earth unit is operable to receive the processed electrical energy transmitted from the applicator unit through a load comprising the plant, and wherein the earth electrode comprises a surface that is configured so as to electrically couple the earth unit to the ground, and wherein the electrical continuity system comprises a signal generator that generates a continuity signal and transmits said signal around a continuity circuit, a signal processing arrangement that at least partially isolates the transmitted continuity signal from the electrical energy, and a control circuit;

directly transmitting the processed electrical energy having the electrical current between the applicator electrode and the earth electrode of the apparatus and through the portion of the plant that extends above the ground to form a circuit that includes the portion of the plant that extends above the ground, wherein the applicator electrode directly transmits the processed electrical energy to at least part of the plant that extends above the ground such that the electrical current travels through the at least part of the plant above ground as part of a circuit and the electrical current returns to the earth electrode through the ground;

transmitting the continuity signal to or in operational proximity to one or both of the electrode(s), wherein the continuity signal is different from the processed electrical energy and includes at least one property;

isolating, using a signal processing arrangement, at least part of the continuity signal from the processed electrical energy;

determining, using the isolated part of the continuity signal or the at least one property related thereto, an electrical continuity between the ground and one or both of the electrodes; and controlling, using said determined electrical continuity, transmission of the processed electrical energy.

* * * * *